(12) United States Patent
Kutsuna et al.

(10) Patent No.: US 11,194,003 B2
(45) Date of Patent: Dec. 7, 2021

(54) MRI APPARATUS AND MRI METHOD

(71) Applicant: Canon Medical Systems Corporation, Otawara (JP)

(72) Inventors: Hideaki Kutsuna, Kawasaki (JP); Hidenori Takeshima, Kawasaki (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 16/804,221

(22) Filed: Feb. 28, 2020

(65) Prior Publication Data
US 2020/0278413 A1    Sep. 3, 2020

(30) Foreign Application Priority Data

Mar. 1, 2019    (JP) .............................. JP2019-037412

(51) Int. Cl.
*G01R 33/565*    (2006.01)
*G01R 33/385*    (2006.01)
*G01R 33/48*    (2006.01)

(52) U.S. Cl.
CPC ..... *G01R 33/56545* (2013.01); *G01R 33/385* (2013.01); *G01R 33/4826* (2013.01)

(58) Field of Classification Search
CPC ............ G01R 33/56545; G01R 33/385; G01R 33/4826
See application file for complete search history.

(56) References Cited

U.S. PATENT DOCUMENTS

| | | | | |
|---|---|---|---|---|
| 6,188,219 B1* | 2/2001 | Reeder | ................... | G01R 33/58 324/307 |
| 8,294,462 B2* | 10/2012 | Stemmer | .......... | G01R 33/56375 324/309 |
| 9,476,956 B2* | 10/2016 | Taniguchi | ........ | G01R 33/56554 |

(Continued)

FOREIGN PATENT DOCUMENTS

WO    WO 2008/152937 A1    12/2008

OTHER PUBLICATIONS

Extended European Search Report dated Apr. 14, 2020, in Patent Application No. 20160110.1, citing documents AA-AB and AT-AY therein, 17 pages.

(Continued)

*Primary Examiner* — G. M. A Hyder
(74) *Attorney, Agent, or Firm* — Oblon, McClelland, Maier & Neustadt, L.L.P.

(57) ABSTRACT

In one embodiment, an MRI apparatus includes a scanner and processing circuitry. The scanner includes at least two gradient coils. The processing circuitry is configured to cause the scanner to acquire k-space data for correction in a band-shaped two-dimensional k-space along a readout direction, or in a columnar three-dimensional k-space along a readout direction, while changing rotation angles, wherein each of the rotation angles corresponds to the readout direction, generate correction data for correcting an error due to a gradient magnetic field generated by the gradient coils, by using the acquired k-space data for correction, cause the scanner to acquire k-space data for reconstruction, based on a radial acquisition method, while correcting the gradient magnetic field by using the correction data, and generate an image by reconstructing the acquired k-space data for reconstruction.

20 Claims, 17 Drawing Sheets

(56) References Cited

U.S. PATENT DOCUMENTS

| | | | |
|---|---|---|---|
| 2010/0164495 A1* | 7/2010 | Takizawa | G01R 33/482 324/309 |
| 2011/0089948 A1 | 4/2011 | Takizawa et al. | |
| 2014/0111203 A1 | 4/2014 | Zhou | |
| 2016/0003929 A1* | 1/2016 | Popescu | G01R 33/4824 324/307 |
| 2018/0188343 A1* | 7/2018 | Liu | G01R 33/56572 |

OTHER PUBLICATIONS

Pipe, J. G. et al., "Turboprop: Improved PROPELLER Imaging", Magnetic Resonance in Medicine, XP055004570, vol. 55, No. 2, Feb. 1, 2006, pp. 380-385.

Zhiqiang, L. et al., "A parallel imaging technique using mutual calibration for split-blade diffusion-weighted PROPELLER", Magnetic Resonance in Medicine, XP055680676, vol. 65, No. 3, Oct. 6, 2010, pp. 638-644.

Lee, C. H. et al., "Turboprop+: Enhanced turboprop diffusion-weighted imaging with a new phase correction : A New Phase Correction in Turboprop DWI", Magnetic Resonance in Medicine, XP055680649, vol. 70, No. 2, Sep. 28, 2012, pp. 497-503.

Tan, H. et al., "3D GRASE PROPELLER: improved image acquisition technique for arterial spin labeling perfusion imaging", Magnetic Resonance in Medicine, XP055004574, vol. 66, No. 1, Jan. 19, 2011, pp. 168-173.

Pipe, J. G. et al., "Motion correction with PROPELLER MRI: Application to head motion and free-breathing cardiac imaging", XP055404416, vol. 42, No. 5, Nov. 1, 1999, pp. 963-969.

Rangwala, N. A., "Reduction of Artifacts Arising From Non-Ideal Gradients in Fast Magnetic Resonance Imaging—chapters 4 and 6", XP055681630, Dec. 1, 2011, 87 pages.

K. T. Block et al., "Simple Method for Adaptive Gradient-Delay Compensation in Radial MRI" Proc. Intl. Soc. Magn. Reson. Med. 19: 2011, p. 2816.

* cited by examiner

CORRECTION BY ADJUSTING APPLICATION TIMING OF GRADIENT PULSE

MRI APPARATUS AND MRI METHOD

CROSS-REFERENCE TO RELATED APPLICATION

This application is based upon and claims the benefit of priority from Japanese Patent Application No. 2019-037412, filed on Mar. 1, 2019, the entire contents of which are incorporated herein by reference.

TECHNICAL FIELD

Disclosed Embodiments relate to a magnetic resonance imaging (MRI) apparatus and an MRI method.

BACKGROUND

An MRI apparatus is an imaging apparatus that magnetically excites nuclear spin of an object placed in a static magnetic field by applying a radio frequency (RF) pulse having the Larmor frequency and reconstructs an image on the basis of magnetic resonance (MR) signals emitted from the object due to the excitation.

In an imaging method using an MRI apparatus, k-space (i.e., frequency space) is filled with raw data that are directly obtained from the digitized MR signals, and an image in the real space is generated by performing reconstruction processing such as Fourier transform on the raw data (i.e., k-space data). Methods for acquiring the k-space data are broadly classified into the Cartesian imaging methods and the Non-Cartesian imaging methods.

Among the Non-Cartesian imaging methods, a radial acquisition method is known as a method of acquiring k-space data along a plurality of lines extending radially from the center of k-space to the outside of k-space. The radial acquisition method is said to be less affected by artifact due to a body motion than the Cartesian imaging methods.

In the radial acquisition method, data (i.e., MR signals) are acquired while the readout direction is being rotated around the origin of k-space, i.e., while the angle of each trajectory with respect to a specific direction in k-space (for example, the X-axis direction) is being changed around a specific point in k-space (usually, around the origin of k-space). For example, when two-dimensional k-space data defined by two coordinate axes composed of the X-axis direction and the Y-axis direction are acquired by the radial acquisition method, a gradient pulse in the X-axis direction and a gradient pulse in the Y-axis direction are simultaneously applied during the read-out period while magnitudes of both gradient pulses are being changed depending on the read-out direction.

Thus, the error of the sampling position in k-space in the radial acquisition method is combination of the respective errors of the gradient pulse in the X-axis direction and the gradient pulse in the Y-axis direction. Since the gradient pulse in the X-axis direction and the gradient pulse in the Y-axis direction are applied by weighting depending on the readout direction, the error in the sampling position shows different values depending on the readout direction.

As a result, the actual trajectory of the k-space data at the time of sampling MR signals (i.e., at the time of reading out the k-space data) differs from the intended trajectory. For this reason, such an error in the radial acquisition method is also called a trajectory error. Due to the trajectory error, distortion and spatial misregistration are included in the reconstructed image.

Although several measures to reduce the trajectory error have been studied, they are not necessarily satisfactory and further improvement is desired.

DETAILED DESCRIPTION

Hereinbelow, the first embodiment of the present invention will be described by referring to the accompanying drawings.

In one embodiment, an MRI apparatus includes a scanner and processing circuitry. The scanner includes at least two gradient coils. The processing circuitry is configured to cause the scanner to acquire k-space data for correction in a band-shaped two-dimensional k-space along a readout direction, or in a columnar three-dimensional k-space along a readout direction, while changing rotation angles, wherein each of the rotation angles corresponds to the readout direction, generate correction data for correcting an error due to a gradient magnetic field generated by the gradient coils by using the acquired k-space data for correction, cause the scanner to acquire k-space data for reconstruction based on a radial acquisition method, while correcting the gradient magnetic field by using the correction data, and generate an image by reconstructing the acquired k-space data for reconstruction.

First Embodiment

Figure 1:
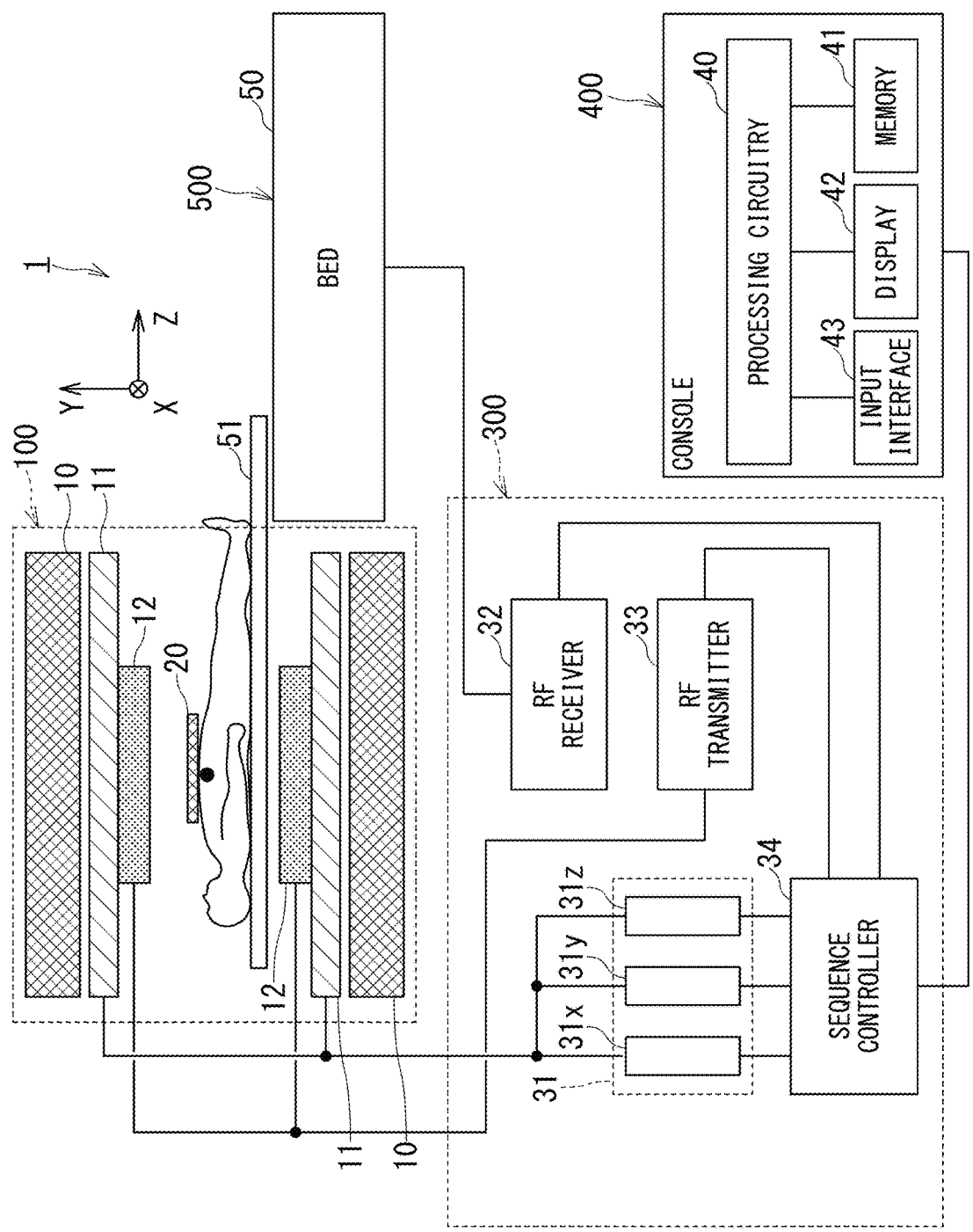
FIG. 1 is a configuration diagram illustrating an overall configuration of an MRI apparatus according to each embodiment.

FIG. 1 is a block diagram illustrating an overall configuration of an MRI apparatus 1 according to the first embodiment. The MRI apparatus 1 of the first embodiment includes a gantry 100, a control cabinet 300, a console 400, and a bed 500.

The gantry 100 includes a static magnetic field magnet 10, a gradient coil assembly 11, and a whole body (WB) coil 12, and these components are housed in a cylindrical housing. The bed 500 includes a bed body 50 and a table 51. In addition, the MRI apparatus 1 includes at least one RF coil 20 to be disposed close to an object.

The control cabinet 300 includes three gradient coil power supplies 31 (31x for an X-axis, 31y for a Y-axis, and 31z for a Z-axis), an RF receiver 32, an RF transmitter 33, and a sequence controller 34.

The static magnetic field magnet 10 of the gantry 100 is substantially in the form of a cylinder, and generates a static magnetic field inside a bore, which is a space formed inside the cylindrical structure and serves as an imaging region of the object (for example, a patient). The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current to be provided from a static magnetic field power supply (not shown) in an excitation mode. Afterward, the static magnetic field magnet 10 shifts to a permanent current mode, and the static magnetic field power supply is separated. Once it enters the permanent current mode, the static magnetic field magnet 10 continues to generate a strong static magnetic field for a long time, for example, over one year. Note that the static magnetic field magnet 10 may be configured as a permanent magnet.

The gradient coil assembly 11 is also substantially in the form of a cylinder and is fixed to the inside of the static magnetic field magnet 10. The gradient coil assembly 11 has a three-channel structure and includes an X-axis gradient coil 11x, a Y-axis gradient coil 11y, and a Z-axis gradient coil 11z (not shown individually). The X-axis gradient coil 11x is supplied with electric current from the gradient magnetic field power supply 31x so as to generate a gradient magnetic field Gx in the X-axis direction. The Y-axis gradient coil 11y is supplied with electric current from the gradient magnetic field power supply 31y so as to generate a gradient magnetic field Gy in the Y-axis direction. The Z-axis gradient coil 11z is supplied with electric current from the gradient magnetic field power supply 31z so as to generate a gradient magnetic field Gz in the Z-axis direction.

The bed body 50 of the bed 500 can move the table 51 in the vertical direction and in the horizontal direction. The bed body 50 moves the table 51 with an object placed thereon to a predetermined height before imaging. Afterward, when the object is imaged, the bed body 50 moves the table 51 in the horizontal direction so as to move the object to the inside of the bore.

The WB body coil 12 is shaped substantially in the form of a cylinder so as to surround the object, and is fixed to the inside of the gradient coil assembly 11. The WB coil 12 applies RF pulses to be transmitted from the RF transmitter 33 to the object, and receives magnetic resonance (MR) signals emitted from the object due to excitation of hydrogen nuclei.

The RF coil 20 receives MR signals emitted from the object at a position close to the object. The RF coil 20 includes plural coil elements, for example. Depending on the anatomical imaging part of the object, there are various RF coils 20 such as for the head, for the chest, for the spine, for the lower limbs, and for the whole body. Of these various RF coils, FIG. 1 illustrates the RF coil 20 for imaging the chest.

The RF transmitter 33 transmits an RF pulse to the WB coil 12 on the basis of an instruction from the sequence controller 34. The RF receiver 32 detects MR signals received by the WB coil 12 and/or the RF coil 20, and transmits raw data obtained by digitizing the detected MR signals to the sequence controller 34.

The sequence controller 34 performs a scan of the object by driving the gradient coil power supplies 31, the RF transmitter 33, and the RF receiver 32 under the control of the console 400. When the sequence controller 34 receives the raw data from the RF receiver 32 by performing the scan, the sequence controller 34 transmits the received raw data to the console 400.

The sequence controller 34 includes processing circuitry (not shown). This processing circuitry is configured as, for example, a processor for executing predetermined programs or configured as hardware such as a field programmable gate array (FPGA) and an application specific integrated circuit (ASIC).

The console 400 is configured as a computer that includes processing circuitry 40, a memory 41, a display 42, and an input interface 43.

The memory 41 is a recording medium including a read-only memory (ROM) and a random access memory (RAM) in addition to an external memory device such as a hard disk drive (HDD) and an optical disc device. The memory 41 stores various programs to be executed by a processor of the processing circuitry 40 as well as various data and information.

The display 42 is a display device such as a liquid crystal display panel, a plasma display panel, and an organic EL panel.

The input interface 43 includes various devices for an operator to input various data and information, and is configured of, for example, a mouse, a keyboard, a trackball, and/or a touch panel.

The processing circuitry 40 is, for example, a circuit provided with a central processing unit (CPU) and/or a special-purpose or general-purpose processor. The processor implements various functions described below by executing the programs stored in the memory 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

The console 400 controls the entirety of the MRI apparatus 1 with these components. Specifically, the console 400 accepts imaging conditions such as the type of pulse sequence, various information, and an instruction to start imaging to be inputted by a user such as a medical imaging technologist through the input interface 43 including a mouse and a keyboard. The processing circuitry 40 causes the sequence controller 34 to perform a scan on the basis of the inputted imaging conditions and reconstructs an image on the basis of the raw data transmitted from the sequence controller 34, i.e., digitized MR signals. The reconstructed image is displayed on the display 42 and is stored in the memory 41.

In the configuration of the MRI apparatus 1 shown in FIG. 1, the control cabinet 300, the gantry 100, and the bed 500 (i.e., all the components except the console 400) constitute an imaging unit or scanner 600.

Figure 2B:
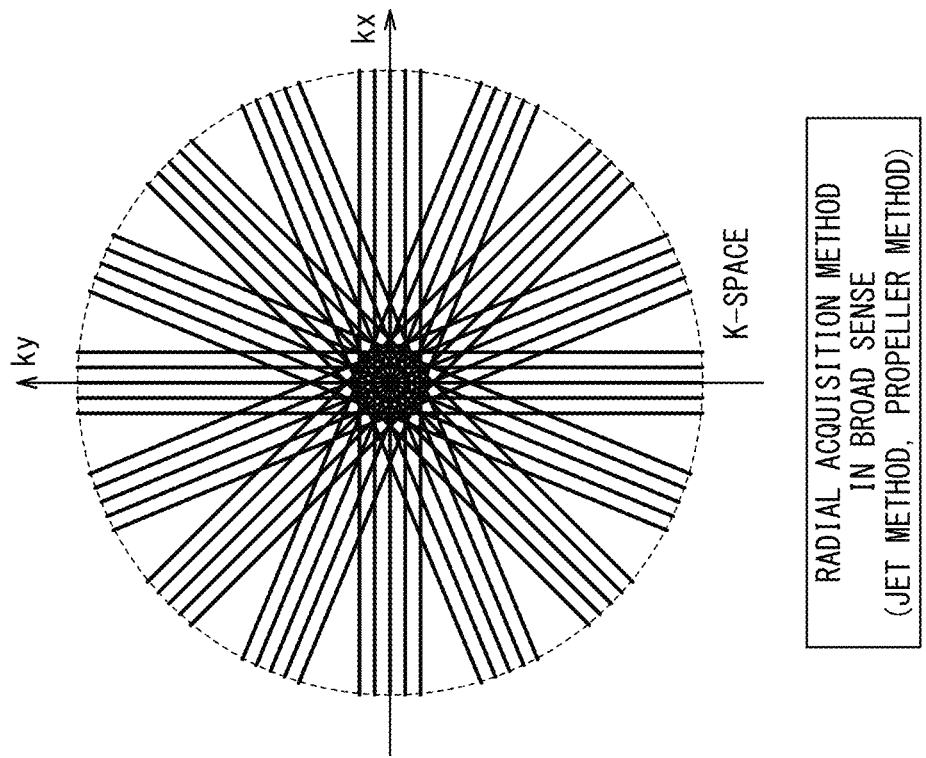
FIG. 2A and FIG. 2B are schematic diagrams illustrating the radial acquisition method to be performed by the MRI apparatus.
Figure 2A:
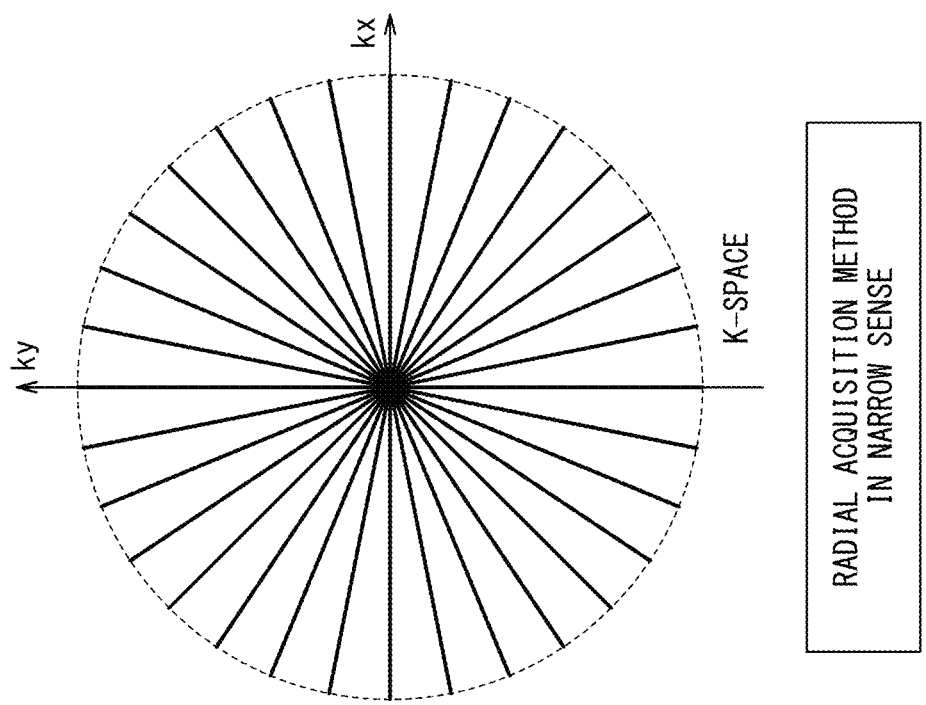

FIG. 2A and FIG. 2B are schematic diagrams illustrating the radial acquisition method that is one of the main sequences to be performed by the MRI apparatus 1. FIG. 2A shows the radial acquisition method in a narrow sense, and FIG. 2B shows the radial acquisition method in a broad sense.

In the radial acquisition method in a narrow sense, a trajectory is formed radially around a predetermined point in k-space (usually, the origin of k-space), and k-space data are acquired linearly along a defined readout direction which is coincident with the trajectory, while changing rotation angles. Here, each of the rotation angles corresponds to the readout direction. Data for filling the entirety of k-space can be acquired by changing the readout direction from, for example, 0° to 180°.

In the radial acquisition method in a broad sense, k-space data are acquired from a band-shaped region along the readout direction, while changing the rotation angles. In other words, data of the band-shaped k-space region having a predetermined width are acquired by reading a plurality of lines parallel to each other at one rotation angle, and each band-shaped k-space region is called a blade. Data for filling the entirety of k-space are acquired by rotating the band-shaped k-space region, for example, around the origin of k-space. The radial acquisition method in a broad sense is also called a JET method or a PROPELLER method.

If any error occurs in the gradient pulse generated by the gradient coil assembly 11, i.e., if the waveform of the actually generated gradient pulse differs from the intended ideal waveform, the actual trajectory of the k-space data at the time of sampling each MR signal (i.e., at the time of reading the k-space data) differs from the intended trajectory. As described above, such an error is also called a trajectory error.

In the radial acquisition method, the trajectory error shows different values depending on the angle of the readout direction. For this reason, distortion and spatial misregistration may occur in the reconstructed image.

The MRI apparatus 1 according to the embodiments is configured to reduce the trajectory error in the radial acquisition method. However, prior to detailed descriptions of the MRI apparatus 1, causes of the trajectory error will be described below First, the trajectory error in the Cartesian imaging method will be described by referring to FIG. 3. Here, a description will be given of the case where the readout direction in the Cartesian imaging method is the X-axis direction (i.e., the right-left direction of the object lying horizontally on the table 51 as shown in FIG. 1).

Figure 3:
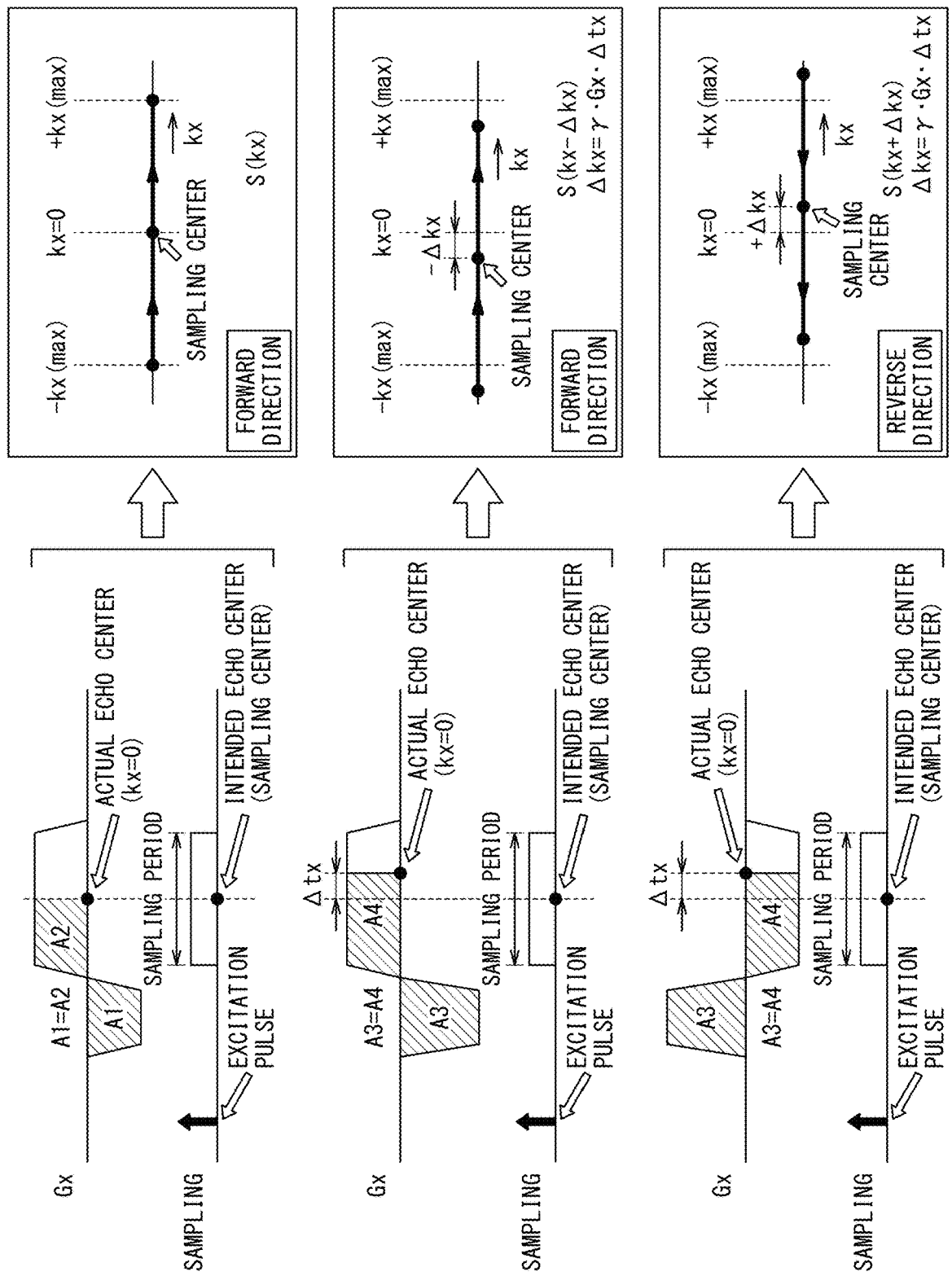
FIG. 3 is a schematic diagram illustrating a trajectory error in the Cartesian imaging method.

The upper left part of FIG. 3 shows the waveform of the readout gradient pulse Gx in the X-axis direction in an ideal state, the excitation pulse, and the sampling period. In each of the six parts of FIG. 3, the phase encoding gradient pulse (Gy) and the slice selection gradient pulse (Gz) are omitted.

In the following, the main lobe of the readout gradient pulse Gx corresponding to the sampling period is referred to as a "readout lobe", and the lobe of the opposite polarity applied immediately before the readout lobe is referred to as a "dephasing lobe". In an ideal gradient pulse, the readout lobe and the dephasing lobe are set such that the half area "A2" of the readout lobe matches the area "A1" of the dephasing lobe. As a result, as shown in the upper right part of FIG. 3, the k-space data sampled at the center of the sampling period become data that correspond to the position of the center of k-space (i.e., kx=0), and thus, the intended echo center coincides with the actually acquired echo center. Here, the one-dimensional k-space data are hereinafter denoted by Expression 1.

$$S(kx) - kx(\max) \leq kx \leq +kx(\max) \qquad \text{Expression 1}$$

In Expression 1, S(kx) is a complex number.

When S(kx) is subjected to one-dimensional Fourier transform, one-dimensional real-space data Im(x) are obtained. Assuming that the Fourier transform is represented by F[·], Expressions 2 and 3 below are established.

$$Im(x) = F[S(kx)] \qquad \text{Expression 2}$$

$$Im(x) = |Im(x)| \cdot \exp[j\varphi(x)] \qquad \text{Expression 3}$$

In Expression 3, |Im(x)| is the absolute value of the one-dimensional real-space data and φ(x) represents the phase of the one-dimensional real-space data.

The middle left part of FIG. 3 shows the readout gradient pulse Gx shifted from the ideal readout gradient pulse Gx in the X-axis direction, i.e., the readout gradient pulse Gx having an error. The excitation pulse and the sampling period in the middle left part of FIG. 3 are the same as those of the upper left part of FIG. 3. Various factors can be considered as causes of error of the readout gradient pulse Gx. The waveform and application timing of the actual gradient pulse may not match the intended ideal waveform and intended application timing, due to, for example, timing deviation of the gradient current applied to the gradient coil assembly 11, the distortion of the waveform of the gradient current, hardware imperfections of the gradient coil assembly 11, and/or the influence of the eddy magnetic field.

The middle left part of FIG. 3 shows a case in which the area "A3" of the dephasing lobe is larger than the intended area "A1" (A3>A1). The position of the kx-space, which has been deflected in the negative direction by the dephasing lobe, starts to return to the positive direction along with the start of the readout lobe, and then crosses the center of k-space at the timing when the area "A4" of the readout lobe becomes equal to the area "A3" of the dephasing lobe. Thus, the timing delayed from the center of the sampling period by the delay time Δtx becomes the actual echo center (kx=0). Hence, as shown in the middle right part of FIG. 3, the k-space data sampled at the center of the sampling period become data corresponding to the position that is shifted from the center of k-space (i.e., kx=0) to the negative side by Δkx. Accordingly, one-dimensional k-space data, which are actually acquired, can be expressed by Expression 4 with reference to Expression 1.

$$S(kx - \Delta kx) \qquad \text{Expression 4}$$

As to Δkx, Expression 5 is established.

$$\Delta kx = \gamma \cdot |Gx| \cdot \Delta tx \qquad \text{Expression 5}$$

In Expression 5, γ is the gyromagnetic ratio, |Gx| is the gradient magnetic field strength of the readout lobe, and Δtx is the difference between the actual echo center and the intended echo center on the time axis. Note that, Δtx is the error (or shift amount) of the gradient pulse on the time axis, and Δkx is the error (or shift amount) of the sampled k-space data in k-space.

In the middle part of FIG. 3, the direction in which the k-space data are sampled (i.e., readout direction) is the direction from the negative to the positive of k-space, and this direction is referred to as the forward direction. Imf(x) is defined as one-dimensional real-space data obtained by performing one-dimensional Fourier transform on the forward k-space data represented by Expression 4, and Imf(x) is expressed as follows.

$$Imf(x) = F[S(kx - \Delta kx)] \quad \text{Expression 6}$$
$$= Im(x) \cdot \exp[-j(2\Pi) \cdot \Delta kx \cdot x]$$

The sign inside exp[ ] of Expression 6 is a sign when Fourier transform F[S(k)] for S(k) is defined by the following expression.

$$F[S(k)] = \int [S(k) \cdot \exp[-j(2\pi) \cdot k \cdot x]] dk$$

Although the sign inside exp[ ] of Expression 6 is reversed in the case where Fourier transform F[S(k)] for S(k) is defined by the following expression, the following logic does not lose generality by this.

$$F[S(k)] = \int [S(k) \cdot \exp[j(2\pi) \cdot k \cdot x]] dk$$

Here, Expressions 7 and 8 are established by referring to Expression 3.

$$Imf(x) = |Im(x)| \cdot \exp[j\varphi(x)] \cdot \exp[-j(2\Pi) \cdot \Delta kx \cdot x] \quad \text{Expression 7}$$
$$= |Im(x)| \cdot \exp[j\Phi f(x)] \quad \text{Expression 8}$$

In Expressions 7 and 8, $\Phi f(x)$ is the phase of one-dimensional real-space data in data acquisition in the forward direction and is expressed by Expression 9.

$$\Phi f(x) = \varphi(x) - (2\pi) \cdot \Delta kx \cdot x \quad \text{Expression 9}$$

On the other side, the lower left part of FIG. 3 shows a case where the area "A3" of the dephasing lobe is larger than the intended area "A1" (A3>A1), similarly to the middle left part of FIG. 3. However, the sign of each of the dephasing lobe and the readout lobe is reversed, and thereby the direction in which the k-space data are sampled (i.e., readout direction) is set as the direction from the positive side to the negative side of k-space, as shown in the lower right part FIG. 3. This direction is hereinafter referred to as the reverse direction.

In the sampling in the reverse direction, the k-space data to be sampled at the center of the sampling period (i.e., the center of the readout lobe) become data corresponding to the position that is shifted from the center of k-space (i.e., kx=0) to the positive side by $\Delta kx$. Thus, in the one-dimensional k-space data, the sign of $\Delta kx$ in Expression 4 changes from "−" to "+" and becomes S(kx+$\Delta kx$).

When one-dimensional real-space data obtained by performing one-dimensional Fourier transform on the k-space data in the reverse direction are defined as Imb(x), Expressions 7, 8, and 9 in the forward direction are respectively replaced by Expressions 10, 11, and 12 as follows.

$$Imb(x) = |Im(x)| \cdot \exp[j\varphi(x)] \cdot \exp[-j(2\Pi) \cdot \Delta kx \cdot x] \quad \text{Expression 10}$$
$$= |Im(x)| \cdot \exp[j\Phi b(x)] \quad \text{Expression 11}$$

In Expressions 10 and 11, $\Phi b(x)$ is the phase of one-dimensional real-space data in data acquisition in the reverse direction, and is expressed by Expression 12.

$$\Phi b(x) = \varphi(x) + (2\pi) \cdot \Delta kx \cdot x \quad \text{Expression 12}$$

The difference $\Delta \Phi (x)$ between the phase $\Phi f (x)$ in the forward direction and the phase $\Phi r(x)$ in the reverse direction in real space is expressed as follows.

$$\Delta \Phi(x) = \Phi f(x) - \Phi b(x) = -(4\pi) \cdot \Delta kx \cdot x \quad \text{Expression 13}$$

That is, the phase $\varphi (x)$ of the one-dimensional real space data, which is common to $\Phi f(x)$ and $\Phi b(x)$, is canceled by the subtraction, and consequently, $\Delta kx \cdot x$ remains. Thus, the error $\Delta kx$ in k-space can be calculated from the phase gradient $\Delta kx$ with respect to x. Further, the error $\Delta tx$ on the time axis can be calculated from the error $\Delta kx$ and Expression 5.

As described above, in the Cartesian imaging method, the trajectory error ($\Delta kx$ and $\Delta tx$) due to non-ideal gradient pulses can be calculated relatively easily.

Figure 4:
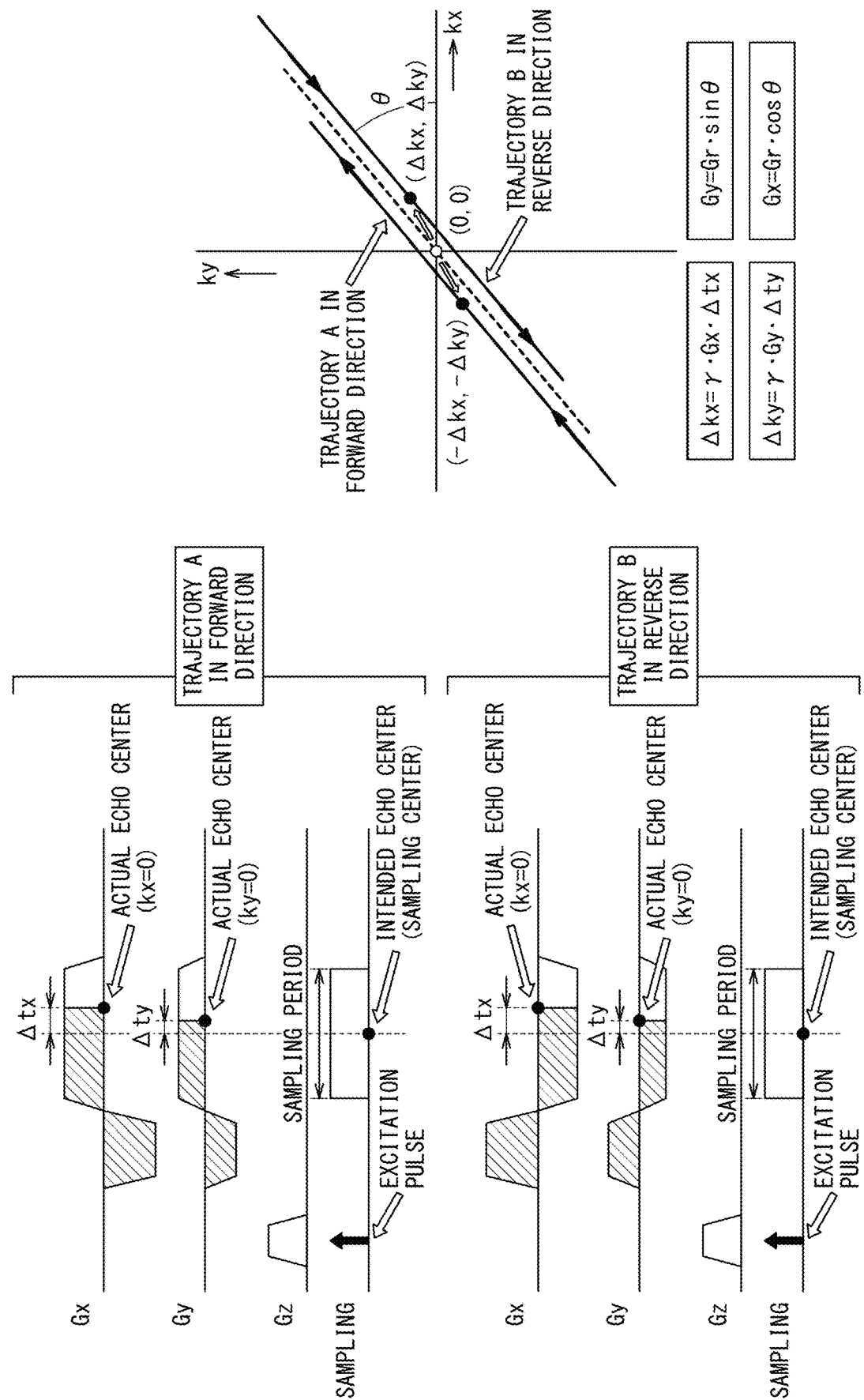
FIG. 4 is a schematic diagram illustrating a trajectory error in the radial acquisition method.

Next, the trajectory error in the radial acquisition method will be described by referring to FIG. 4. The right side of FIG. 4 shows an acquisition trajectory of k-space data when the angle of the readout direction is θ. In the right side of FIG. 4, the broken line indicates the trajectory when there is no error in the gradient magnetic field. The solid line above the broken line indicates the trajectory A in the forward direction when there is an error in the gradient magnetic field, and the solid line below the broken line indicates the trajectory B in the reverse direction when there is an error in the gradient magnetic field. As shown in the right side of FIG. 4, when there is an error in the gradient magnetic field in the radial acquisition method, the trajectory A in the forward direction and the trajectory B in the reverse direction are separated from each other and do not match.

In the two-dimensional radial acquisition method, as shown in the left side of FIG. 4, the gradient pulse Gr for readout is formed by combining the gradient pulse Gx in the X-axis direction and the gradient pulse Gy in the Y-axis direction. The gradient pulse Gx in the X-axis direction and the gradient pulse Gy in the Y-axis direction change depending on the angle θ in the readout direction and are expressed as follows, for example.

$$|Gx| = |Gr| \cdot \sin\theta \, |Gy| = |Gr| \cdot \cos\theta$$

Here, as shown in the left side of FIG. 4, it is assumed that an error on the time axis occurs due to the error in the gradient pulse Gx in the X-axis direction, and the actual echo center (i.e., center of k-space) is delayed by $\Delta tx$ from the intended echo center (i.e., sampling center). Similarly, it is assumed that an error on the time axis occurs due to the error in the gradient pulse Gy in the Y-axis direction, and the actual echo center is delayed by $\Delta ty$ from the intended echo center.

In this case, as shown in the right side of FIG. 4, the trajectory A in the forward direction is shifted from the ideal trajectory by $\Delta kx$ to the left and by $\Delta ky$ downward in k-space. On the other hand, the trajectory B in the reverse direction is shifted from the ideal trajectory by $\Delta kx$ to the right and by $\Delta ky$ upward in k-space. Here, $\Delta kx$ and $\Delta ky$ are given by the following expressions.

$$\Delta kx = \gamma \cdot |Gx| \cdot \Delta tx \quad \text{Expression (5)}$$
$$\Delta ky = \gamma \cdot |Gy| \cdot \Delta ty \quad \text{Expression (14)}$$

In the Cartesian imaging method, as described using FIG. 3, the shift of the error $\Delta kx$ in k-space is converted into the phase $\Delta kx \cdot x$ in the real space by performing one-dimensional Fourier transform on the k-space data. Further, the phase φ (x) of the true real-space data, which corresponds to the phase without error, is canceled by taking difference between the phase Φf(x) (Expression 9) in the forward direction and the phase Φb(x) (Expression 12) in the reverse direction after one-dimensional Fourier transform. As a result, the phase Δkx·x caused only by the error can be extracted, and the error Δkx in k-space can be detected from the gradient with respect to x. The important point in this method is that the trajectory in the forward direction and the trajectory in the reverse direction are on the same line. In other words, the phase φ (x) of the true real-space data is common to both of the phase obtained by performing one-dimensional Fourier transform on the trajectory in the forward direction and the phase obtained by performing one-dimensional Fourier transform on the trajectory in the reverse direction.

However, in the radial acquisition method as shown in the right part of FIG. 4, the trajectory A in the forward direction and the trajectory B in the reverse direction do not exist on the same line. Thus, between the phase Φf obtained by performing one-dimensional Fourier transform on the trajectory A and the phase Φb obtained by performing one-dimensional Fourier transform on the trajectory B, a common phase (i.e., true real-space data) does not exist. For this reason, regardless of whether the difference between the phase Φf and the phase Φb can be calculated or not, the errors Δkx and Δky in k-space cannot be accurately calculated. For the same reason, the errors Δtx and Δty on the time axis of the gradient magnetic field cannot be accurately calculated.

Thus, in the conventional method described above, it is difficult to accurately calculate the errors to be generated in the radial acquisition method, i.e., the errors Δkx and Δky in k-space or the errors Δtx and Δty on the time axis of the gradient magnetic field, and consequently, the trajectory error in the radial acquisition method cannot be properly suppressed.

The MRI apparatus 1 of the present embodiment solves the above-described problem. Hereinafter, the configuration of the MRI apparatus 1 and the methods of reducing the trajectory error will be specifically described in detail.

Figure 5:
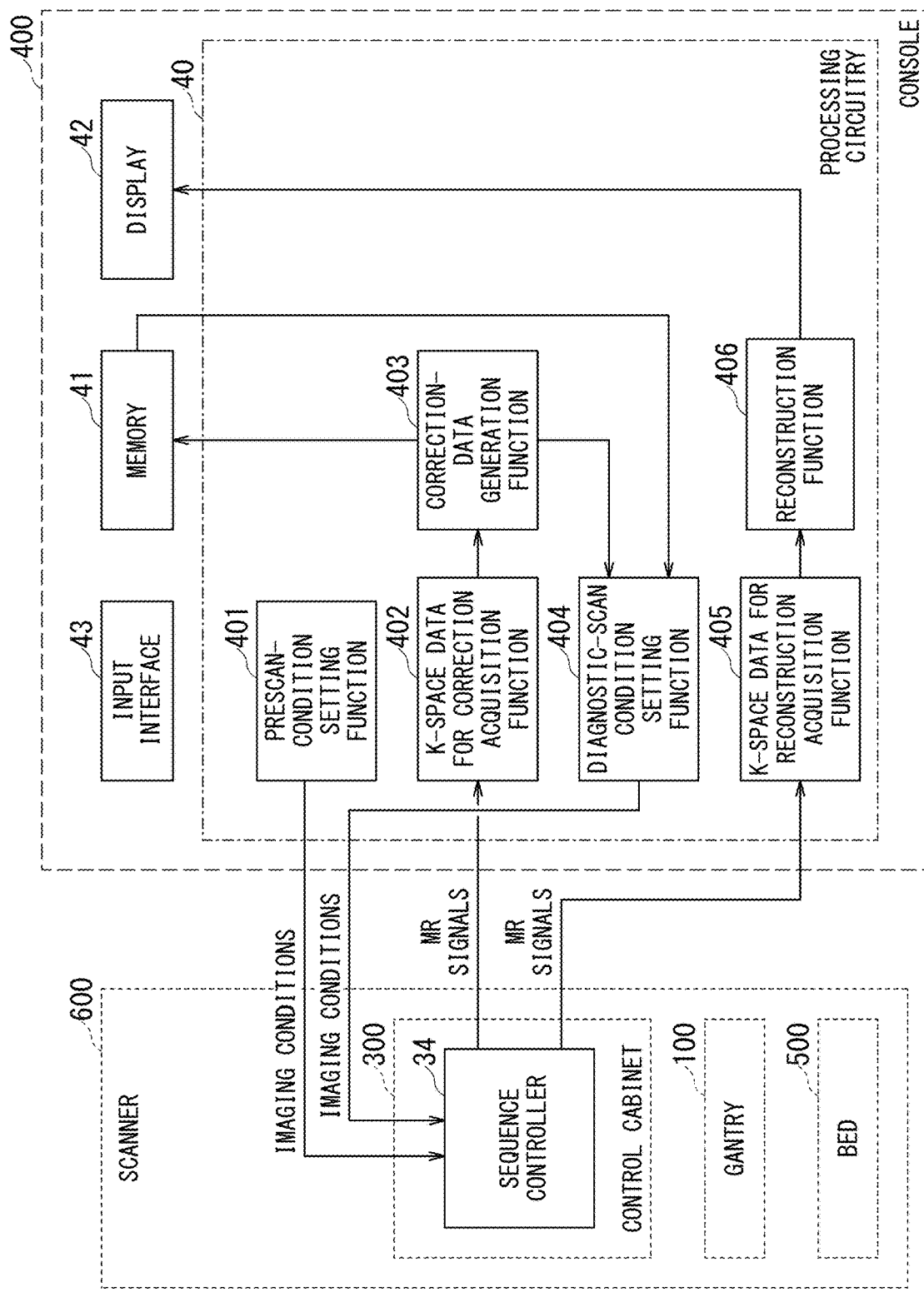
FIG. 5 is a functional block diagram of the MRI apparatus according to the first embodiment.

FIG. 5 illustrates a functional block diagram of the MRI apparatus 1 mainly focusing on the processing circuitry 40. As shown in FIG. 5, the processing circuitry 40 of the MRI apparatus 1 implements each of a prescan-condition setting function 401, a k-space data for correction acquisition function 402, a correction-data generation function 403, a diagnostic-scan condition setting function 404, a k-space data for reconstruction acquisition function 405, and a reconstruction function 406. The processing circuitry 40 implements these functions by causing the processor included in the processing circuitry 40 to execute predetermined programs.

The prescan-condition setting function 401 sets imaging conditions such as a pulse sequence to be used in a prescan. The prescan is a scan for acquiring k-space data necessary to generate correction data that are used for correcting errors due to non-ideal gradient pulses or the gradient magnetic field. The set imaging conditions are inputted to the sequence controller 34.

The k-space data for correction acquisition function 402 performs a prescan, before or in parallel with execution of the diagnostic scan, so as to acquire two-dimensional k-space data for correction. Specifically, the k-space data for correction acquisition function 402 causes the sequence controller 34 to perform a prescan on the band-shaped region along the readout direction in two-dimensional k-space such that the band-shaped region is sequentially changed by changing rotation angles to acquire the two-dimensional k-space data for correction (MR signals). Here, each of the rotation angles corresponds to the readout direction.

The correction data generation function 403 uses the acquired two-dimensional k-space data for correction for generating correction data that are used for correcting errors due to the gradient magnetic field generated by the gradient coil assembly 11.

The diagnostic-scan condition setting function 404 sets imaging conditions such as a pulse sequence to be used in the diagnostic scan (which is also called a main scan). The diagnostic scan includes the radial acquisition method in a broad sense (i.e., the acquisition method called the JET method or the PROPELLER method), in addition to the radial acquisition method in a narrow sense described using FIG. 2. The set imaging conditions are inputted to the sequence controller 34.

As described below, the MRI apparatus 1 of the first embodiment corrects the application timing and/or magnetic-field strength of each gradient pulse by using the correction data. Specifically, the diagnostic-scan condition setting function 404 sets a pulse sequence having a gradient magnetic field waveform that is corrected by the correction data outputted from the correction data generation function 403 (or the correction data stored in the memory 41). Consequently, the trajectory error is reduced or eliminated in the k-space data acquired by the pulse sequence of the diagnostic scan.

The k-space data for reconstruction acquisition function 405 acquires k-space data for reconstruction (i.e., k-space data acquired in the diagnostic scan for generating a diagnostic image) based on the radial acquisition method by causing the scanner 600 to execute the pulse sequence set by the diagnostic-scan condition setting function 404.

The reconstruction function 406 performs gridding processing including, for example, interpolation on the k-space data for reconstruction acquired by the radial acquisition method to convert the k-space data for reconstruction into k-space data at the grid point position in the Cartesian coordinate system. Thereafter, the reconstruction function 406 performs reconstruction processing including Fourier transform on the converted k-space data to generate a diagnostic image. The "diagnostic image" may be simply referred to as "image."

Figure 6:
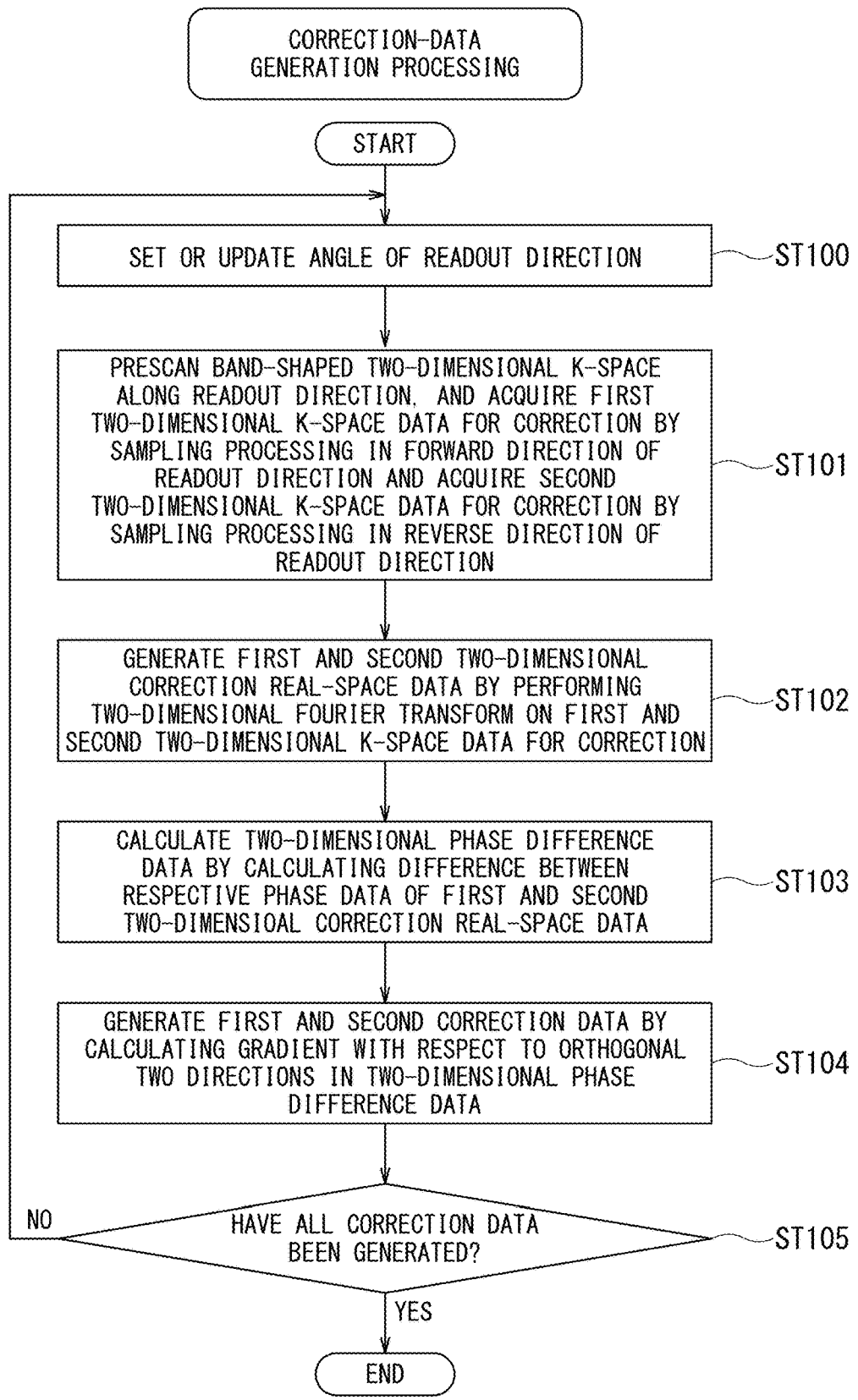
FIG. 6 is a flowchart illustrating an operation of generating correction data in the first embodiment.
Figure 7:
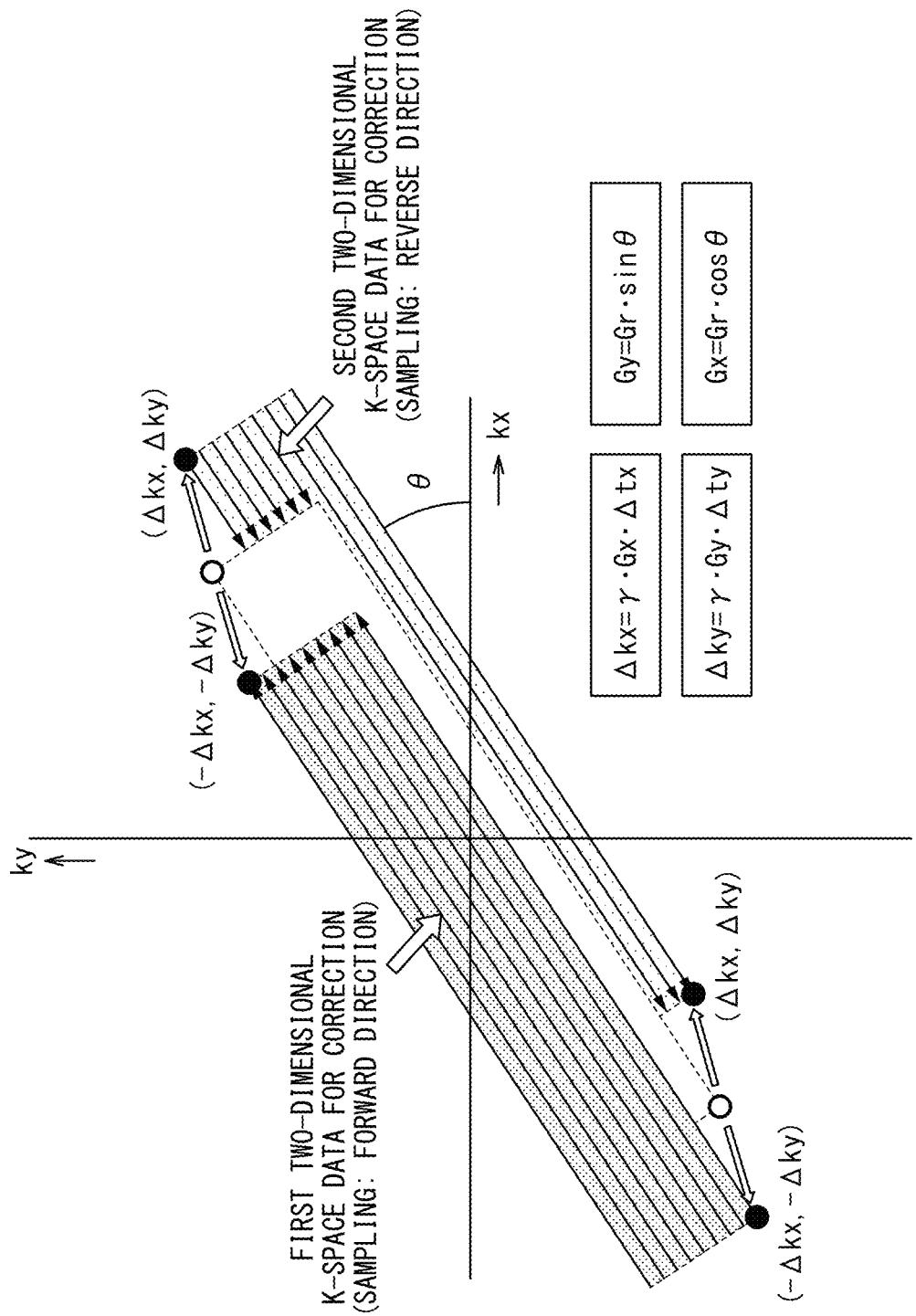
FIG. 7 is a schematic diagram illustrating a concept of acquiring two-dimensional k-space data for correction.
Figure 8:
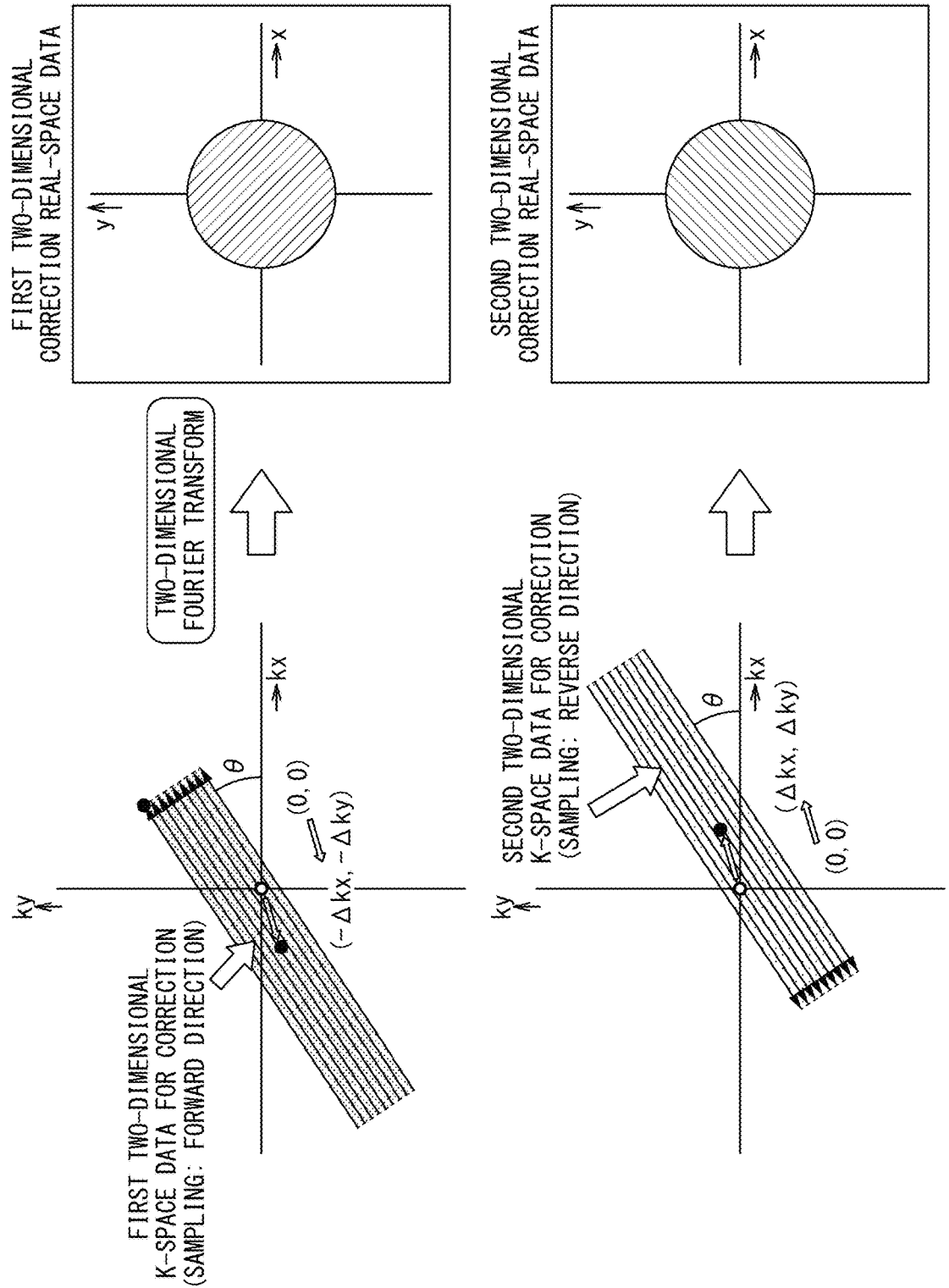
FIG. 8 is a schematic diagram illustrating a concept of generating two-dimensional real-space data for correction.
Figure 9:
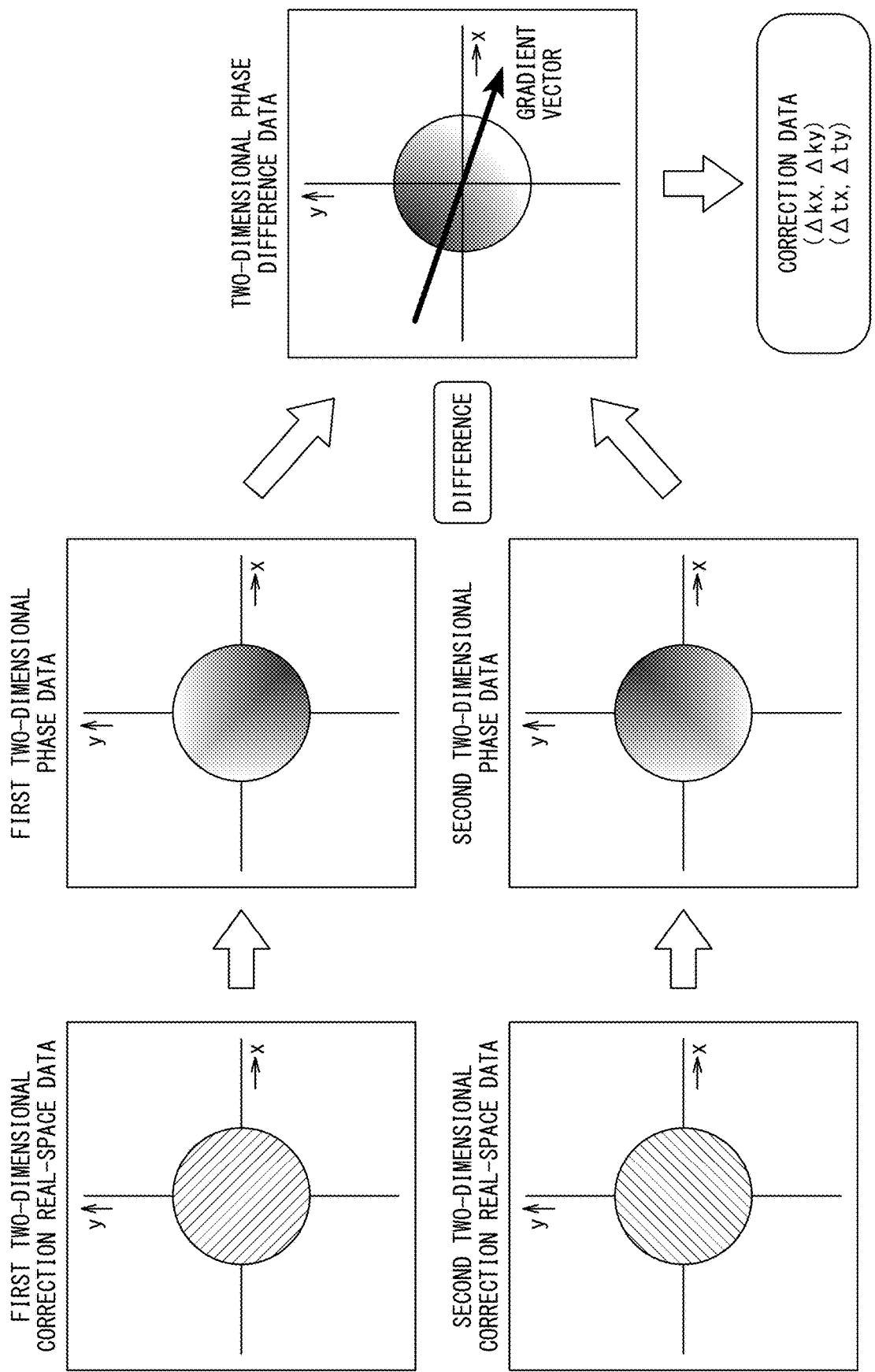
FIG. 9 is a schematic diagram illustrating a concept of generating two-dimensional phase difference data.

FIG. 6 is a flowchart illustrating the operation of generating the correction data among various operations executed by the MRI apparatus 1 according to the first embodiment. FIG. 7 to FIG. 9 are schematic diagrams illustrating the concept of generating the correction data.

The correction data are generated by using data acquired by the prescan, which is performed before the diagnostic scan for generating a diagnostic image. The prescan may be performed when the MRI apparatus 1 is installed in, for example, a hospital or may be performed during a periodic inspection. When performing the prescan at the time of installation or periodic inspection, for example, a phantom may be used as an imaging target. The correction data, which are generated in the prescan at the time of installation and/or periodic inspection, are stored in the memory 41. Each time the diagnostic scan is performed, the correction data stored in the memory 41 are read out from the memory and used for correcting the diagnostic scan.

Alternatively, each time the diagnostic scan is performed, the prescan may be performed prior to the diagnostic scan.

In this case, the object (or imaging target) of the prescan may be the same object (for example, patient) as the object of the diagnostic scan.

Further, the diagnostic scan and the prescan may be executed so as to be combined simultaneously or in parallel. For example, the following repetitive processing can be performed each time the angle θ is updated. In this repetitive processing, data in the forward and reverse directions of the prescan at a certain readout angle θ are acquired and used for calculating the correction data, and then, the calculated correction data are used for correcting the data of the diagnostic scan acquired at the same readout angle θ. This processing is repeated each time the angle θ is updated. Alternatively or additionally, the diagnostic scan may serve as the prescan, when the data of the diagnostic scan is corrected after the diagnostic scan is performed.

In the step ST100 in FIG. 6, the angle θ in the readout direction in the radial acquisition method is set as an imaging condition of the prescan.

In the next step ST101, a prescan is preformed such that data of each MR signal are acquired in a band-shaped region along the readout direction in two-dimensional k-space, and thereby the first two-dimensional k-space data for correction are acquired by sampling in the forward direction of the readout direction and the second two-dimensional k-space data for correction are acquired by sampling in the reverse direction of the readout direction.

FIG. 7 is a schematic diagram illustrating the processing of the step ST101. In FIG. 7, the area indicated by the deepest hatching in k-space is the region filled with the first two-dimensional k-space data for correction. In acquisition of the first two-dimensional k-space data for correction, the angle of the readout direction is set to θ and the sampling direction is set to the forward direction (i.e., direction from the lower left to the upper right in FIG. 7). The scanner 600 acquires the first two-dimensional k-space data for correction by performing readout processing a plurality of times while sequentially shifting a line of readout (i.e., shifting phase encodes) in parallel within a predetermined width in the direction perpendicular to the readout direction.

In FIG. 7, the area indicated by the light hatching in k-space is the region filled with the second two-dimensional k-space data for correction. The second two-dimensional k-space data for correction are the same as the first two-dimensional k-space data for correction in terms of the angle θ in the readout direction, shape and size of the band-shaped region, but differs from the first two-dimensional k-space data for correction in that the sampling direction is the reverse direction (i.e., direction from the upper right to the lower left in FIG. 7).

It is preferred that the acquisition region of each of the first and second two-dimensional k-space data for correction includes the point at the center of k-space (kx=0, ky=0) as shown in FIG. 7. When the acquisition region of each of the first and second two-dimensional k-space data for correction is set so as to include the center of k-space, a high-contrast reconstructed image (i.e., real-space data for correction after Fourier transform) is acquired, and consequently, highly accurate correction data can be acquired.

The white band-shaped region in the center of FIG. 7 shows the virtual true two-dimensional k-space data that can be acquired in the case of applying the ideal and error-free gradient pulses having the intended waveform. However, in practice, errors Δtx and Δty on the time axis and errors Δkx and Δky in k-space occur as shown in FIG. 4 due to errors caused by imperfections of the gradient pulses.

Note that, the two-dimensional k-space data Sf(kx, ky) and Sb(kx, ky) in the forward and reverse directions, which are acquired for calculating the errors Δkx and Δky, are data that the virtual true two-dimensional k-space data S(kx, ky) is respectively shifted by Δkx in the kx direction and by Δky in the ky direction due to the error of the gradient pulses.

Due to the errors Δkx and Δky in k-space, the virtual true two-dimensional k-space data shift in k-space. Also in the case of two-dimensional acquisition data, the shift direction of the virtual true two-dimensional k-space data is the reverse direction corresponding to the forward and reverse directions of the sampling direction, similarly to the one-dimensional acquisition data shown in FIG. 4.

For example, as shown in FIG. 7, with respect to the sampling processing in the forward direction, the virtual true two-dimensional k-space data are shifted by −Δkx in the kx direction and by −Δky in the ky direction so as to become the first two-dimensional k-space data for correction. With respect to the sampling processing in the reverse direction, the virtual true two-dimensional k-space data are shifted by +Δkx in the kx direction and by +Δky in the ky direction so as to become the second two-dimensional k-space data for correction.

The errors Δkx and Δky are expressed by Expressions 5 and 14, similarly to the case of FIG. 4.

$$\Delta kx = \gamma \cdot |Gx| \cdot \Delta tx \qquad \text{Expression 5}$$

$$\Delta ky = \gamma \cdot |Gy| \cdot \Delta ty \qquad \text{Expression 14}$$

The errors Δkx and Δky show different values depending on the angle θ in the readout direction by the two relational expressions of $|Gx|=|Gr|\cdot\sin\theta$ and $|Gy|=|Gr|\cdot\cos\theta$. In addition, since Δtx and Δty may also change depending on the history of Gx and Gy, Δkx and Δky cannot be expressed by simple functions with respect to the readout direction.

When the virtual true two-dimensional k-space data are denoted as S(kx, ky), the first two-dimensional k-space data for correction Sf(kx, ky) and the second two-dimensional k-space data for correction Sb(kx, ky) are respectively expressed by Expressions 15 and 16.

$$Sf(kx,ky) = S(kx - \Delta kx, ky - \Delta ky) \qquad \text{Expression 15}$$

$$Sb(kx,ky) = S(kx + \Delta kx, ky + \Delta ky) \qquad \text{Expression 16}$$

Returning to FIG. 6, in the step ST102, the first and second two-dimensional real-space data for correction are respectively generated by subjecting the first and second two-dimensional k-space data for correction to two-dimensional Fourier transform.

FIG. 8 is a schematic diagram illustrating the processing concept of the step ST102. In the case of FIG. 8, the first and second two-dimensional real-space data for correction are images of a phantom having a circular X-Y cross-section, for example. Hereinafter, the virtual true two-dimensional real-space data are denoted as Im(x, y), the first two-dimensional real-space data for correction are denoted as Imf(x, y), and the second two-dimensional real-space data for correction denoted as Imb(x, y). These three are expressed by Expressions 17 to 19.

$$Im(x,y) = F[S(kx,ky)] \qquad \text{Expression 17}$$

$$Imf(x,y) = F[Sf(kx,ky)] = F[S(kx - \Delta kx, ky - \Delta ky)] \qquad \text{Expression 18}$$

$$Imb(x,y) = F[Sb(kx,ky)] = F[S(kx + \Delta kx, ky + \Delta ky)] \qquad \text{Expression 19}$$

All of Im(x, y), Imf(x, y), and Imb(x, y) are complex numbers. In Expressions 17 to 19, two-dimensional Fourier transform is denoted as F[·].

In the processing of two-dimensional Fourier transform, the band-shaped region shown in the left part of FIG. 8 may be directly subjected to two-dimensional Fourier transform. However, two-dimensional Fourier transform may be performed after making the number of data in the readout direction equal to the number of data in the orthogonal direction by filling the outside of the band-shaped region with zeros (i.e., in the direction orthogonal to the readout direction). The apparent resolution in the orthogonal direction can be made almost equal to that in the readout direction by the zero filling processing.

Returning to FIG. 6, in the step ST103, two-dimensional phase difference data are calculated by subtraction between a complex phase of the first two-dimensional real-space data for correction and a a complex phase of the second two-dimensional real-space data for correction.

In the next step ST104, the gradient of the two-dimensional phase difference data with respect to the two orthogonal directions is calculated so as to generate the first and second correction data.

FIG. 9 is a schematic diagram illustrating the processing concept of the steps ST103 and ST104. The left part and the middle part of FIG. 9 show the anterior half of the processing of the step ST103. The phase term is extracted from the first two-dimensional real-space data for correction, which are complex number, and then used for generating the first two-dimensional phase data $\Phi f(x, y)$. Similarly, the phase term is extracted from the second two-dimensional real-space data for correction and then used for generating the second two-dimensional phase data $\Phi b(x, y)$.

The region from which the two-dimensional phase data are to be extracted may be determined by threshold determination based on the absolute value of the two-dimensional real-space data. When the threshold determination is used for the extraction, regions where the signal level is small or zero (i.e., region where only the noise is included) are excluded, and thus, two-dimensional phase data in a region having a relatively high SN ratio can be extracted.

In the next step ST103, the difference between the respective phase data $\Phi f(x, y)$ and $\Phi b(x, y)$ of the first and second two-dimensional real-space data for correction are calculated and then used for generating the two-dimensional phase difference data $\Delta \Phi(x, y)$. This processing is described below.

On the basis of Expression 18 and the shift theorem of Fourier transform, the first two-dimensional real-space data for correction $Imf(x, y)$ generated by sampling processing in the forward direction is expressed by Expression 20 below.

$$Imf(x,y)=Im(x,y)\cdot\exp[-j(2\pi)\cdot(\Delta kx \cdot x+\Delta ky \cdot y)] \quad \text{Expression 20}$$

Here, Im(x, y) is the virtual true two-dimensional real-space data (complex number). When the phase term of Im(x, y) is denoted as $\varphi(x, y)$, the first two-dimensional phase data $\varphi f(x, y)$ are acquired from Expressions 21 and 22 below.

$$Imf(x,y)=|Im(x,y)|\cdot\exp[j\Phi f(x,y)] \quad \text{Expression 21}$$

$$\Phi f(x,y)=\varphi(x,y)-(2\pi)\cdot(\Delta kx \cdot x+\Delta ky \cdot y) \quad \text{Expression 22}$$

Similarly, on the basis of Expression 19 and the shift theorem of Fourier transform, the second two-dimensional real-space data for correction $Imb(x, y)$ generated by sampling processing in the reverse direction is expressed by Expression 23 below.

$$Imb(x,y)=Im(x,y)\cdot\exp[j(2\pi)\cdot(\Delta kx \cdot x+\Delta ky \cdot y)] \quad \text{Expression 23}$$

Similarly, when the phase term of the virtual true two-dimensional real-space data Im(x, y) is denoted as $\varphi(x, y)$, the second two-dimensional phase data $\varphi b(x, y)$ are acquired from Expressions 24 and 25 below.

$$Imb(x,y)=|Im(x,y)|\cdot\exp[j\Phi b(x,y)] \quad \text{Expression 24}$$

$$\Phi b(x,y)=\varphi(x,y)+(2\pi)-(\Delta kx \cdot x+\Delta ky \cdot y) \quad \text{Expression 25}$$

In the posterior half of the processing of the step ST103, the difference between the first and second two-dimensional phase data $\Phi f(x, y)$ and $\Phi b(x, y)$ is calculated and thereby, the two-dimensional phase difference data $\Delta \Phi(x, y)$ are acquired.

$$\Delta\Phi(x,y)=\Phi f(x,y)-\Phi b(x,y)=-(4\pi)(\Delta kx \cdot x+\Delta ky \cdot y) \quad \text{Expression 26}$$

Focusing on Expressions 22 and 25, these expressions include the phase term $\varphi(x, y)$ of the virtual true two-dimensional real space data Im(x, y) in common. Thus, in Expression 26 obtained as the difference between these two expressions, the common phase term $\varphi(x, y)$ is canceled and only the term $\Delta kx \cdot x$ caused by the k-space error $\Delta kx$ and the term $\Delta kx \cdot y$ caused by the k-space error $\Delta ky$ are included.

In the next step ST104, as shown in the right part of FIG. 9, the k-space error $\Delta kx$ is calculated from the gradient of the two-dimensional phase difference data $\Delta \Phi(x, y)$ in the kx direction, and the k-space error $\Delta ky$ is calculated from the gradient of the two-dimensional phase difference data $\Delta \Phi(x, y)$ in the ky direction. Although the method of calculating the gradient $\Delta kx$ in the kx direction and the gradient $\Delta ky$ in the ky direction is not limited to a specific method, these $\Delta kx$ and $\Delta ky$ can be calculated by fitting the two-dimensional phase difference data $\Delta \Phi(x, y)$ to a plane in $\Delta \Phi$, X, Y space, for example, Note that phase unwrapping processing may be performed on the two-dimensional phase difference data $\Delta \Phi(x, y)$ between the steps ST103 and ST104 as required. Phase continuity can be ensured by the phase unwrapping processing.

Returning to FIG. 6, in the step ST105, completion determination is performed. In other words, it is determined whether the correction data have been generated for all the readout directions or not. If the determination result is negative, the processing returns to the step ST100 in which the angle of the readout direction is updated to a new angle, and then the processing from the steps ST101 to ST104 is repeated.

In this manner, for each angle θ in the readout direction, the errors $\Delta kx$ and $\Delta ky$ in k-space are calculated as the correction data. On the basis of the errors $\Delta kx$ and $\Delta ky$, the errors $\Delta tx$ and $\Delta ty$ on the time axis of the gradient pulses can also be calculated as the correction data by using Expressions 5 and 14. The calculated correction data $\Delta kx$, $\Delta ky$, $\Delta tx$, and $\Delta ty$ are stored in, for example, the memory 41 and are used for the diagnostic scan.

Figure 10:
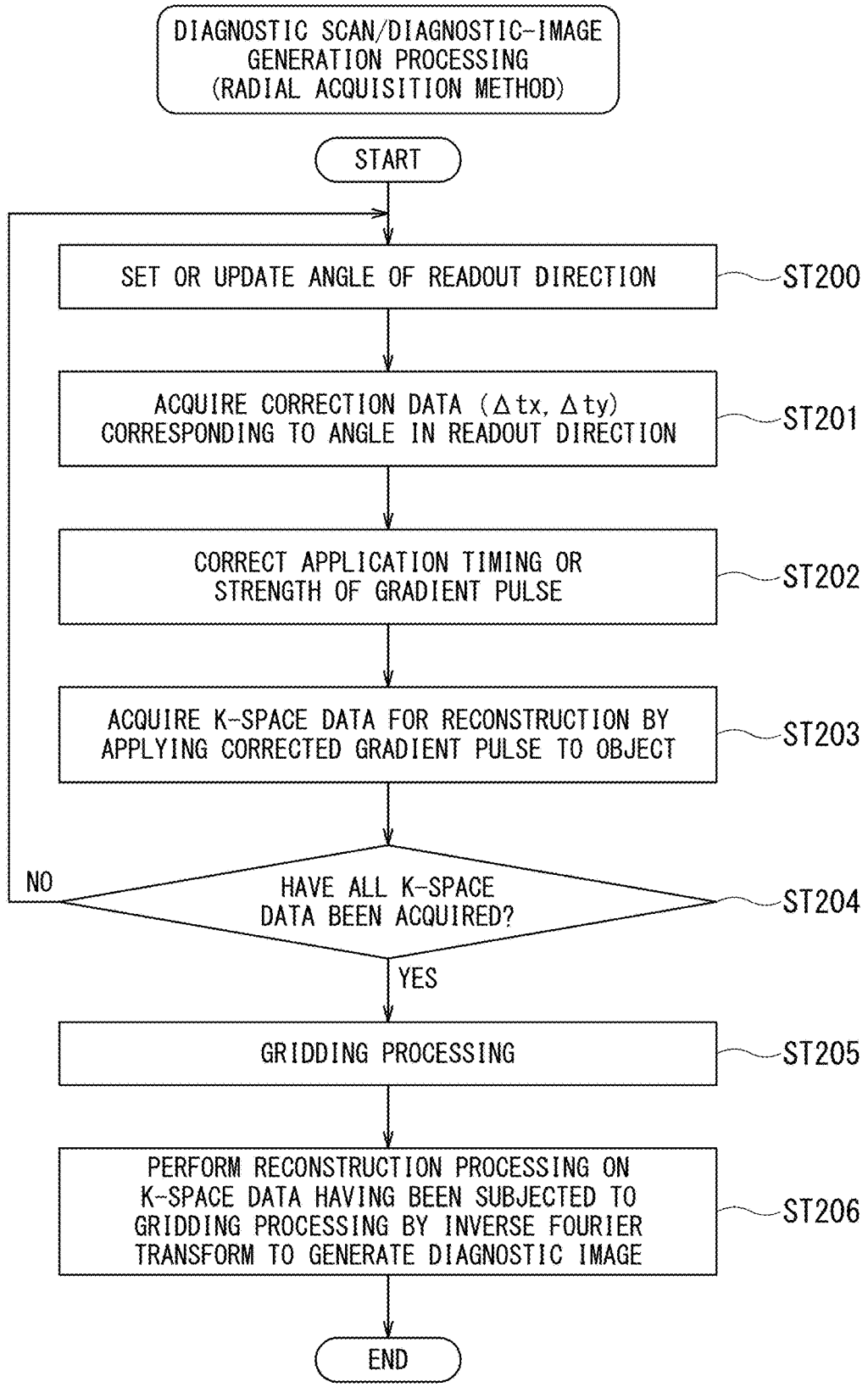
FIG. 10 is a flowchart illustrating an operation of a diagnostic scan in the first embodiment.

FIG. 10 is a flowchart for illustrating the diagnostic scan with the use of the radial acquisition method and processing of generating a diagnostic image on the basis of this diagnostic scan.

In the step ST200, the angle θ in the readout direction in the radial acquisition method is set as an imaging condition of the diagnostic scan. In the next step ST201, the correction data $\Delta tx$ and $\Delta ty$ corresponding to the angle θ in the readout direction are acquired by, for example, reading out the data from the memory 41.

It is not necessarily required that the readout direction of the above-described prescan matches the readout direction of the diagnostic scan. For example, the MRI apparatus 1 may perform the prescan so as to sequentially acquire the correction data at intervals of 10° while sequentially incrementing (or decrementing) the angle of the readout direction by 10°, whereas the MRI apparatus 1 may perform the diagnostic scan so as to sequentially acquire the k-space data for reconstruction at intervals of 1° while sequentially incrementing (or decrementing) the angle of the readout direction by 1°. In this case, for example, after performing interpolation processing on the correction data acquired for every 10° degrees, the correction data can be used for correcting the k-space data for reconstruction of the diagnostic scan performed by incrementing the angle of the readout direction by 1°.

In the next step ST202, application timing or magnetic field strength of each gradient pulse is corrected by using the correction data $\Delta tx$ and $\Delta ty$.

Figure 11:
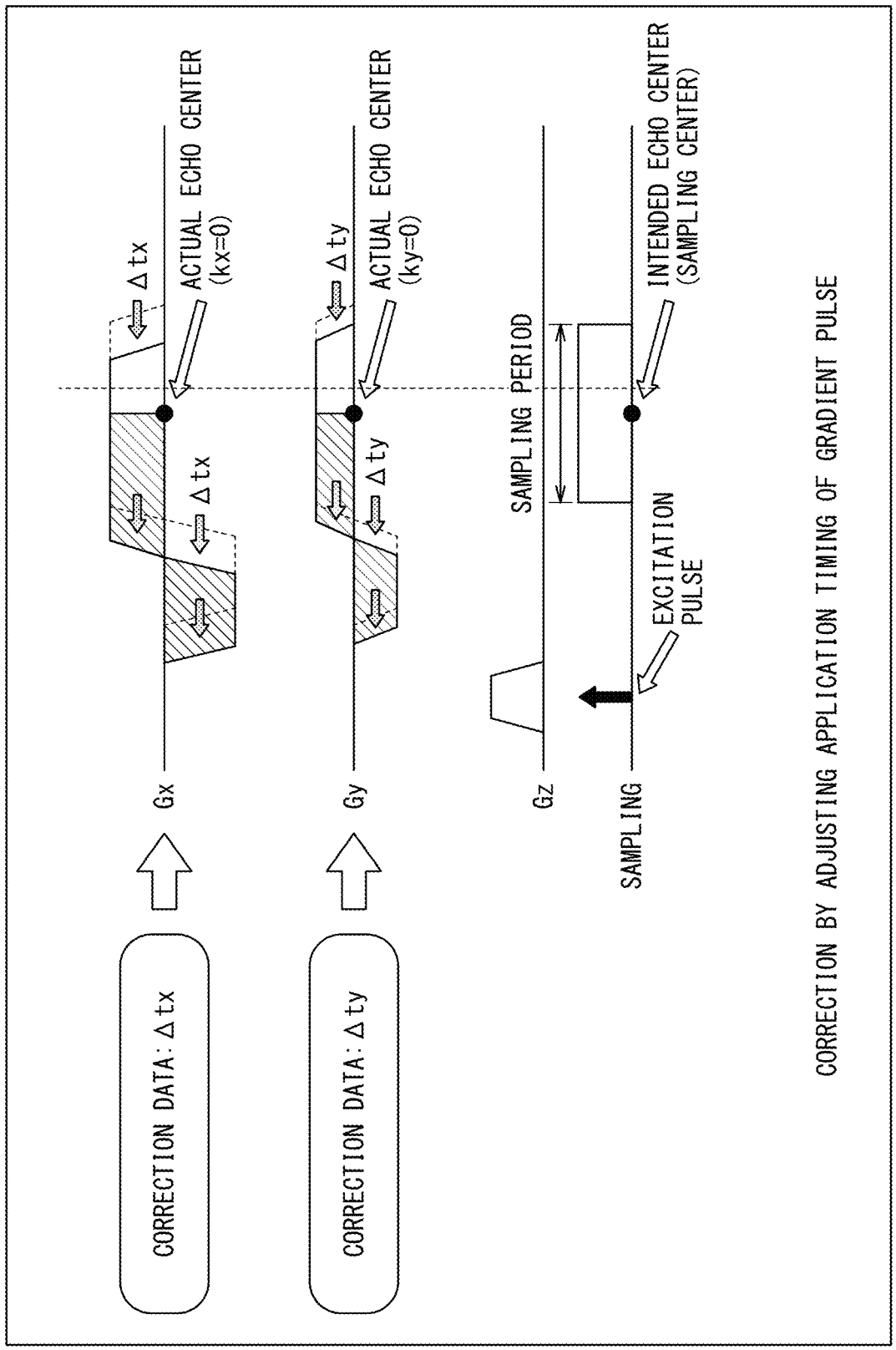
FIG. 11 is a schematic diagram illustrating an operation concept of correcting an application timing of a gradient pulse on the basis of the correction data.

FIG. 11 is a schematic diagram for illustrating the operation concept of correcting the application timing of each gradient pulse by using the correction data $\Delta tx$ and $\Delta ty$. For the gradient pulse Gx in the X-axis direction, a pulse sequence in which the application timing of the gradient pulse Gx is shifted by $\Delta tx$ is set. As a result, data at the echo center (kx=0) in the kx direction can be sampled at the center of the sampling period. Similarly, for the gradient pulse Gy in the Y-axis direction, a pulse sequence in which the application timing of the gradient pulse Gy is shifted by $\Delta ty$ is set. As a result, data at the echo center (ky=0) in the ky direction can be sampled at the center of the sampling period. In this manner, the k-space errors $\Delta kx$ and $\Delta ky$ in the radial acquisition method shown in FIG. 4 can be made zero in both of the sampling processing in the forward direction and the sampling processing in the reverse direction.

When the correction data $\Delta tx$ and $\Delta ty$ are the same between the gradient pulses Gx and Gy, the sampling timing may be corrected by $\Delta t$ ($\Delta t = \Delta tx = \Delta ty$) instead of correcting the application timing of the gradient pulses Gx and Gy.

Returning to FIG. 10, in the step ST203, the MRI apparatus 1 applies the gradient pulses corrected in the above-described manner to the object so as to acquire k-space data for reconstruction that include no trajectory error.

Figure 12:
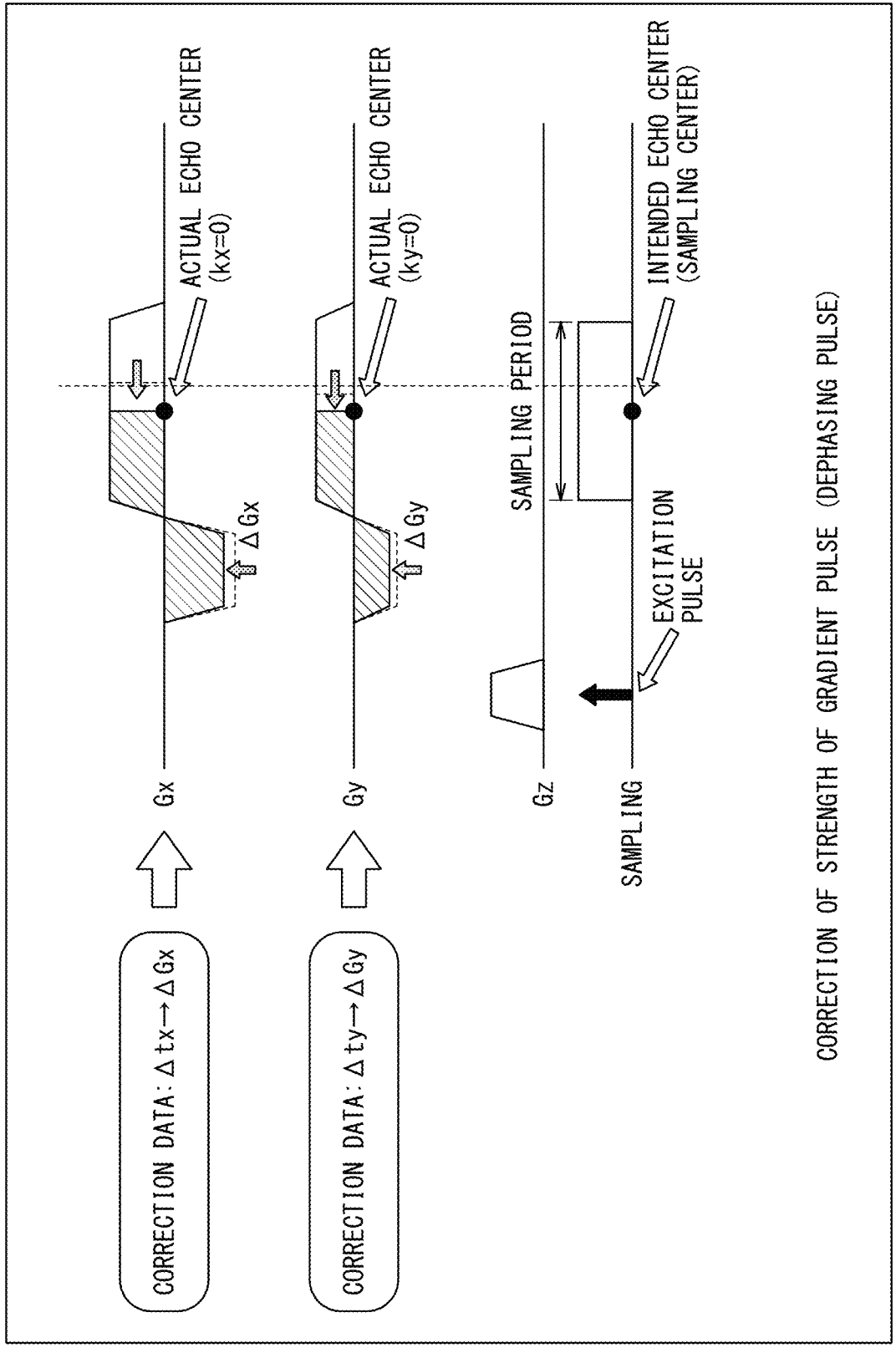
FIG. 12 is a schematic diagram illustrating an operation concept of correcting strength of the gradient pulse on the basis of the correction data.

FIG. 12 is a schematic diagram for illustrating the operation concept of correcting magnetic field strength of each gradient pulse by using the correction data $\Delta tx$ and $\Delta ty$. In the case of FIG. 12, the position of the echo center (kx=0) in the kx direction can be shifted by $\Delta tx$ by correcting the strength of the dephasing lobe immediately before the readout lobe in the X-axis direction by $\Delta Gx$. When the time length of the dephasing lobe in the X-axis direction is denoted as Tdx and the strength of the readout lobe in the X-axis direction is denoted as Grx, for example, $\Delta Gx$ can be calculated by Expression 27.

$$\Delta Gx = Grx \cdot (\Delta tx/Tdx) \quad \text{Expression 27}$$

Similarly, the position of the echo center (ky=0) in the ky direction can be shifted by $\Delta ty$ by correcting the strength of the dephasing lobe immediately before the readout lobe in the Y-axis direction by $\Delta Gy$. When the time length of the dephasing lobe in the Y-axis direction is denoted as Tdy and the strength of the readout lobe in the Y-axis direction is denoted as Gry, $\Delta Gy$ can be calculated by Expression 28.

$$\Delta Gy = Gry \cdot (\Delta ty/Tdy) \quad \text{Expression 28}$$

When the pulse sequence having the strength of the dephasing lobe corrected in this manner is applied, data at the echo center (kx=0) in the kx direction can be sampled at the center of the sampling period and data at the echo center (ky=0) in the ky direction can be sampled at the center of the sampling period.

As a result, the k-space errors $\Delta kx$ and $\Delta ky$ in the radial acquisition method can be made zero in both of the sampling processing in the forward direction and the sampling processing in the reverse direction.

Returning to FIG. 10, in the step ST203, the MRI apparatus 1 applies the gradient pulses corrected in the above-described manner to the object so as to acquire k-space data for reconstruction that include no trajectory error.

The processing from the step ST200 to ST203 is repeated as a series by sequentially incrementing or decrementing the angle of the readout direction. After all the k-space data for reconstruction are acquired, i.e., if the determination result of the step ST204 is affirmative, the processing proceeds to the step ST205. The k-space data for reconstruction (i.e., k-space data to be used for reconstructing a diagnostic image) may be acquired by the radial acquisition method in a narrow sense shown in FIG. 2 or the radial acquisition method in a broad sense such as the JET method and the PROPELLER method.

In the step ST205, the k-space data for reconstruction acquired by the radial acquisition method are subjected to the gridding processing using interpolation so as to be converted into k-space data at the grid point positions in the Cartesian coordinate system.

In the next step ST206, the k-space data converted into the k-space data at the grid point positions in the Cartesian coordinate system are subjected to reconstruction processing using two-dimensional Fourier transform, and thereby a diagnostic image is generated.

In the first embodiment, k-space data without a trajectory error are acquired by applying a pulse sequence that reflects the correction data. Consequently, in the radial acquisition method, k-space data in which all the trajectories pass through the center (origin) of k-space can be acquired, and a diagnostic image with high contrast and little influence of a body motion can be generated.

Second Embodiment

In the second embodiment, the trajectory error is corrected by correcting the k-space data after the diagnostic scan.

Figure 13:
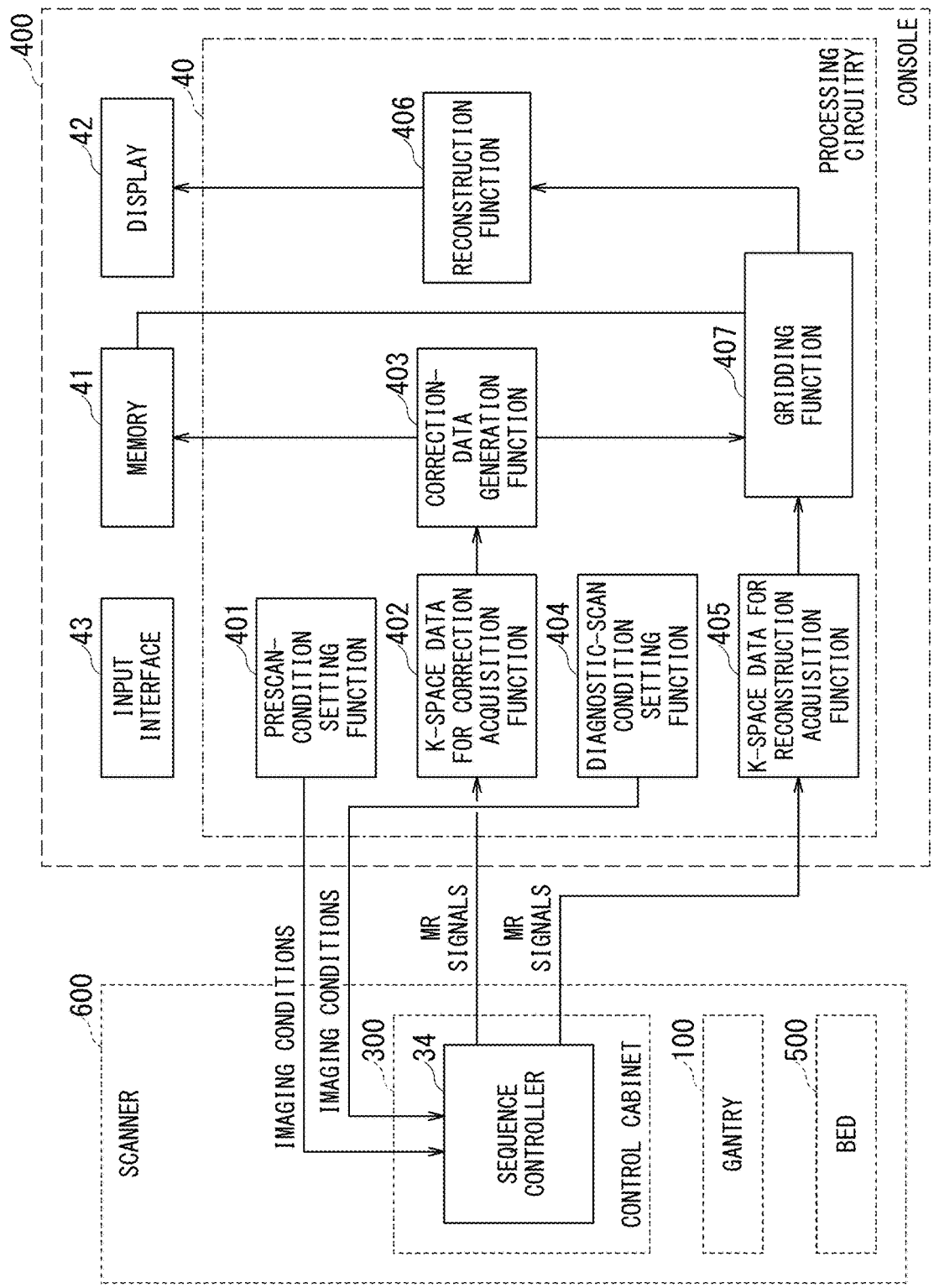
FIG. 13 is a functional block diagram of the MRI apparatus according to the second embodiment.

FIG. 13 is a functional block diagram mainly focusing on the processing circuitry 40 of the MRI apparatus 1 according to the second embodiment. The difference between the first and second embodiments lies in when the correction data are used. In the first embodiment, the pulse sequence, in which the correction data are reflected, are determined by the diagnostic-scan condition setting function 404.

In the second embodiment, instead of reflecting the correction data into the pulse sequence, the correction data are applied to the acquired k-space data to eliminate the trajectory error. Thereafter, the gridding processing is performed on the k-space data, from which the trajectory error has been eliminated or reduced. Additionally or alternatively, the correction data may be reflected in the gridding processing. This processing is performed by the gridding processing function 407 in FIG. 13.

Figure 14:
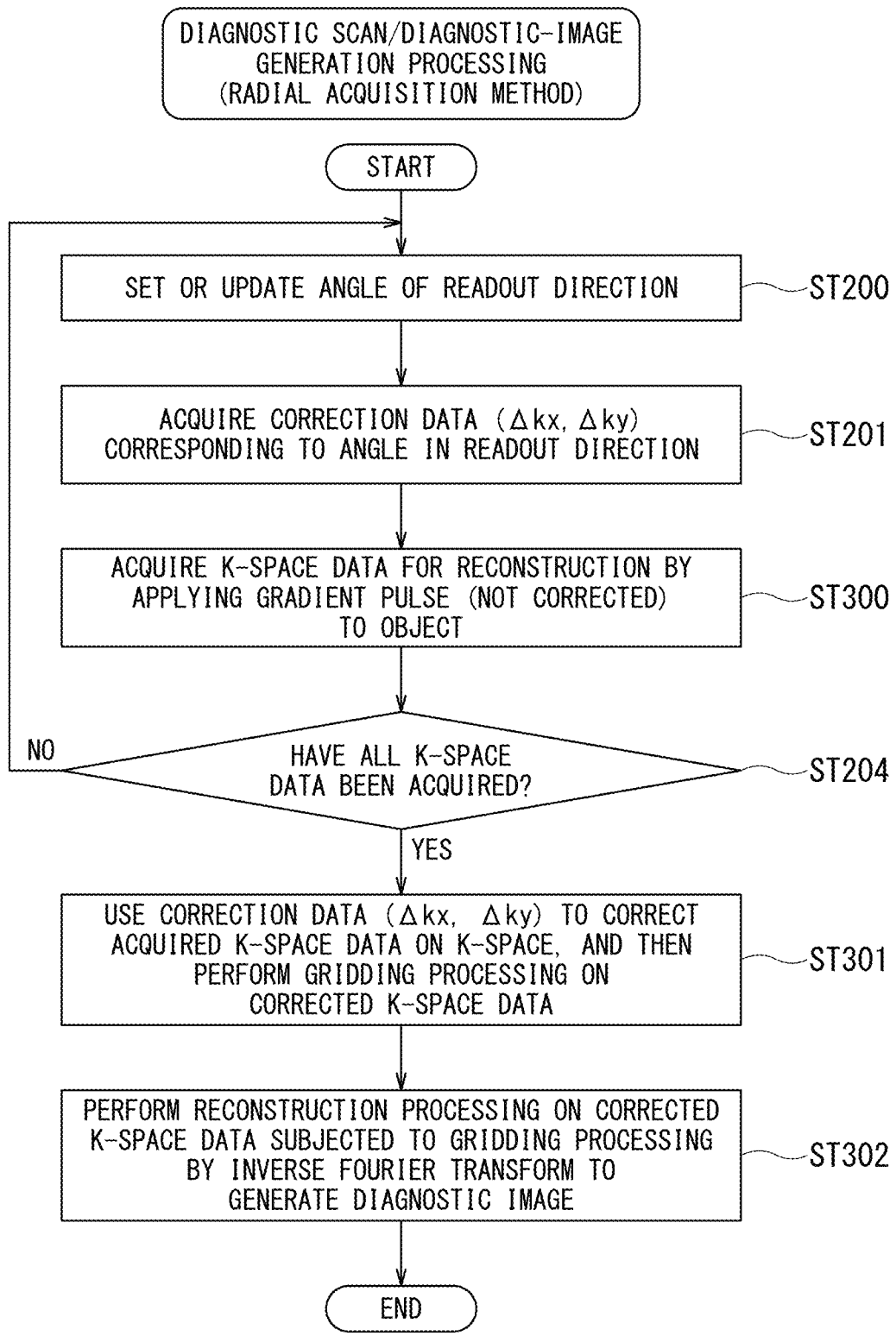
FIG. 14 is a flowchart illustrating an operation of generating the correction data in the second embodiment.

FIG. 14 is a flowchart of the second embodiment for illustrating the processing of the diagnostic scan under the radial acquisition method and the processing of generating a diagnostic image on the basis of this diagnostic scan. Since the processing of generating the correction data by the prescan (i.e., processing shown in the flowchart of FIG. 6) is common to the first and second embodiments, duplicate description is omitted.

In the step ST200 of FIG. 14, the angle θ in the readout direction in the radial acquisition method is set as an imaging condition of the diagnostic scan.

In the next step ST201, the correction data Δkx and Δky corresponding to the angle θ in the readout direction are acquired by, for example, reading out the data from the memory 41.

In the next step ST300, k-space data for reconstruction are acquired by applying uncorrected gradient pulses to the object, i.e., by executing a pulse sequence having been set on the assumption that the trajectory error does not exist.

In the next step ST204, it is determined whether all the k-space data have been acquired or not. If the acquisition of all the k-space data is not completed, the processing returns to the step ST200, in which the angle θ in the readout direction is updated, and then, the processing of the steps ST201 and ST300 is repeated. If the acquisition of all the k-space data is completed, the processing proceeds to the step ST301.

Acquisition of the correction data Δkx and Δky in the step ST201 may be performed after acquisition of all the k-space data and immediately before the step ST301. Since the correction data Δkx and Δky are stored in the memory 41 in association with the angle θ in the readout direction, all of these correction data can be read out together with the angle θ.

Figure 15:
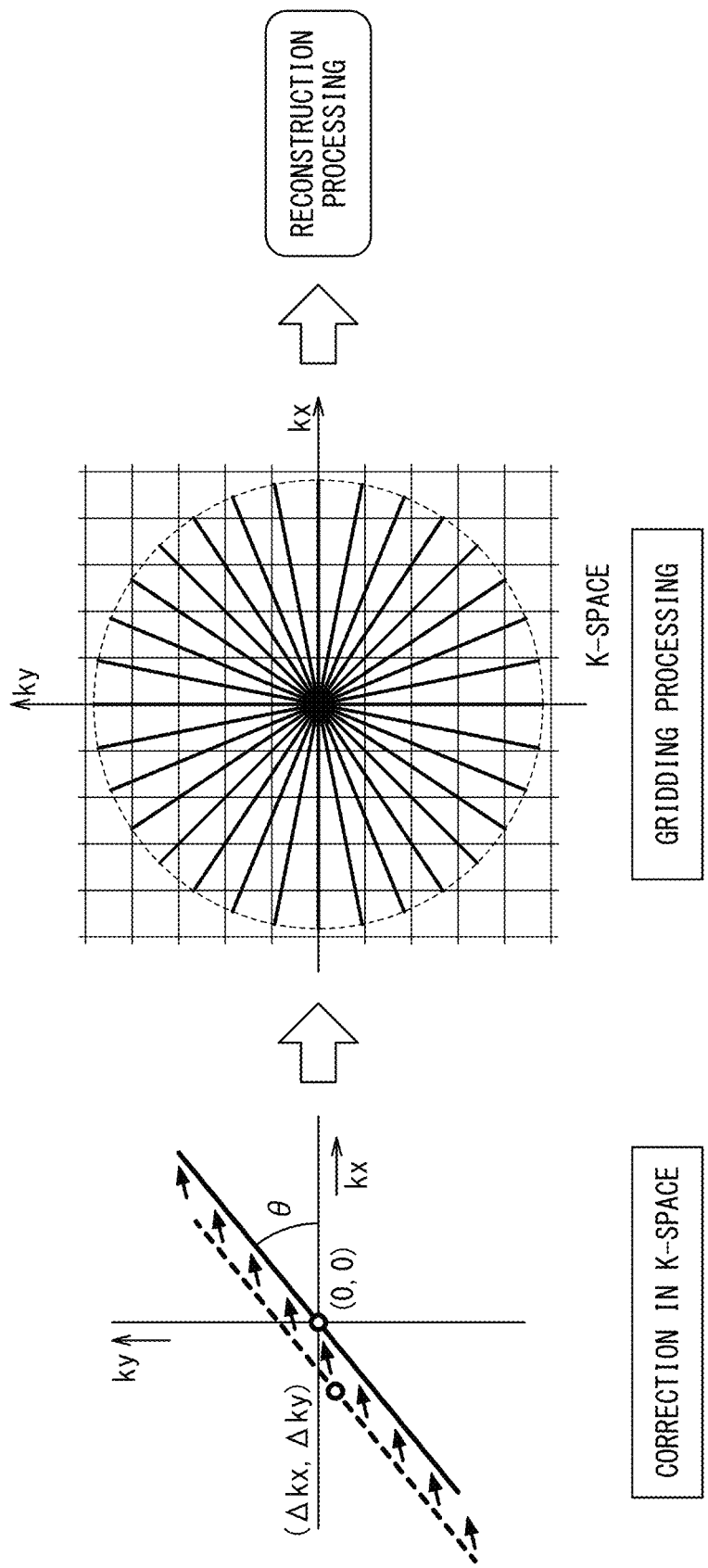
FIG. 15 is a schematic diagram illustrating an operation concept of correcting k-space data in k-space by using the correction data.

FIG. 15 is a schematic diagram illustrating the concept of the processing of the step ST301.

In step ST301, as shown in the left part of FIG. 15, the acquired k-space data are corrected in k-space by using the correction data Δkx and Δky. As a result of this correction, each trajectory, which does not pass through the origin of k-space due to the error in each gradient pulse, is corrected so as to pass through the origin at all the angles θ, as shown in the center part of FIG. 15.

Returning to FIG. 14, in the step ST301, the gridding processing is further performed, and the k-space data acquired under the radial acquisition method are converted into k-space data at the grid point positions in the Cartesian coordinate system.

In the next step ST302, the corrected k-space data after the gridding processing is subjected to reconstruction processing using two-dimensional Fourier transform, and thereby a diagnostic image is generated.

(Modification of Second Embodiment)

When the radial acquisition method in a broad sense such as the JET method (or the PROPELLER method) is used as the diagnostic scan in the above-described second embodiment, the role of the prescan can be included in the diagnostic scan to omit the prescan. In other words, the diagnostic scan may serve as the prescan, when the data of the diagnostic scan is corrected after the diagnostic scan is performed. For example, at each angle θ of the blade (i.e., band-shaped region), both of the k-space data for reconstruction in the forward and k-space data in the reverse directions can be acquired. In this case, the correction data Δkx and Δky at each angle θ can be calculated from the k-space data in the forward and reverse directions in the above-described manner.

Meanwhile, when generating the diagnostic image, either the acquired k-space data in the forward direction or in the reverse direction can be used. For example, only the k-space data in the forward direction can be used. In this case, the trajectory error of the acquired k-space data in the forward direction is corrected by the calculated correction data Δkx and Δky and then the reconstruction processing is performed, for example.

Third Embodiment

In the above-described first and second embodiments, it is assumed that the two-dimensional radial acquisition method is used as the diagnostic scan for obtaining a diagnostic image. For this reason, the prescan is also performed in two dimensions, and the two-dimensional correction data (Δkx, Δky) and (Δtx, Δty) are calculated.

Note that the above-described two-dimensional radial acquisition method is assumed to include the so-called Stack of Stars method. In the Stack of Stars method, a slab having a predetermined thickness is selected such that both faces of this slab is orthogonal to any one of the X-axis, the Y-axis, and the Z-axis, then this slab is excited, and then the scan of the two-dimensional radial acquisition method is performed in the two-dimensional direction along faces of the slab to acquire the MR-signal data while phase-encoding is being applied in the slab thickness direction.

In the third embodiment, the above-described method is extended to three dimensions. As the three-dimensional radial acquisition method, for example, an acquisition method called a Koosh-Ball acquisition method is known. In the Koosh-Ball acquisition method, spherical k-space data is acquired in which a large number of readout lines extend radially from the origin of three-dimensional k-space. The three-dimensional radial acquisition method also includes a method in which data are acquired by tilting the axis orthogonal to both faces of the slab in the above-described Stack of Stars method with respect to any of the X-axis, Y-axis, and Z-axis (this method is also referred to as the Oblique Stack of Stars method).

Figure 16B:
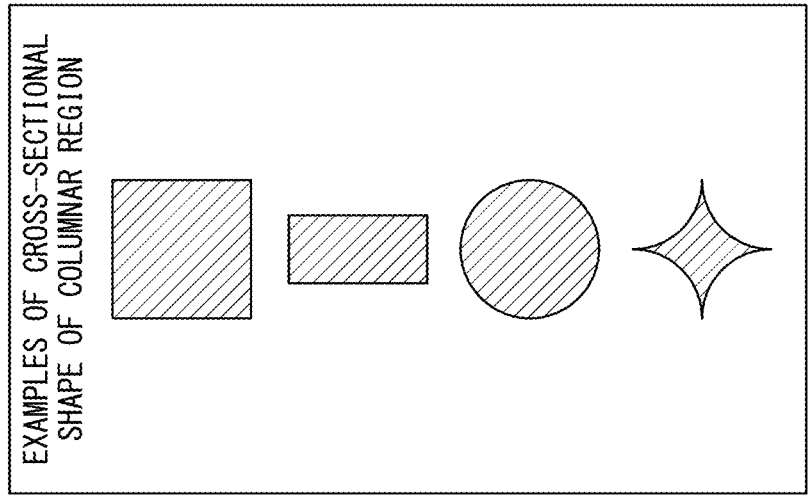
FIG. 16A and FIG. 16B are schematic diagrams for illustrating a first case of a prescan that corresponds to a three-dimensional radial acquisition method.
Figure 16A:
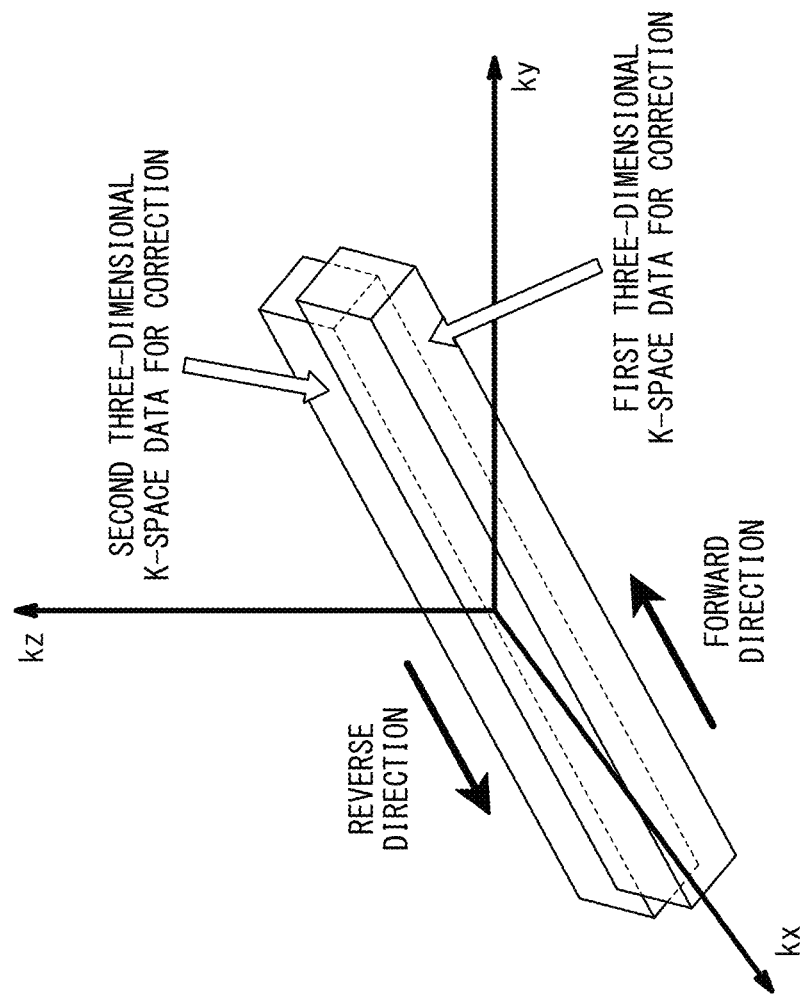

FIG. 16A and FIG. 16B are schematic diagrams for illustrating a concept of a three-dimensional prescan that corresponds to a three-dimensional radial acquisition method. In the three-dimensional prescan, three-dimensional k-space data for correction are acquired by sequentially incrementing the rotation angle in the readout direction and applying phase encoding such that data of each MR signal to be acquired become a columnar region along the readout direction in three-dimensional k-space.

Specifically, in the prescan according to the third embodiment, columnar first three-dimensional k-space data for correction are acquired by sampling processing in the forward direction of the readout direction, while columnar second three-dimensional k-space data for correction are also acquired by sampling processing in the reverse direction of the readout direction. In detail, the first and second three-dimensional k-space data for correction are acquired through the entire space for each direction angle by sequentially incrementing or decrementing rotation angles. Here, each of the rotation angles corresponds to the readout direction in the three-dimensional space. Each of the rotation angles in the three-dimensional space is, for example, the angle indicative of the direction specified by the azimuth angle and the elevation angle in a three-dimensional space. Thereafter, the first and second three-dimensional k-space data for correction are used for generating correction data composed of the first correction data (Δkx or Δtx), the second correction data (Δky or Δty), and the third correction data (Δkz or Δtz) for each rotation angle corresponding to the readout direction such that the first to third correction data correspond to respective three orthogonal directions.

The procedure for calculating each of the first to third correction data from the first and second three-dimensional k-space data for correction is the same as the method in the first and second embodiments. Specifically, the first and second three-dimensional real-space data for correction are generated by performing three-dimensional Fourier transform on the respective first and second three-dimensional k-space data for correction. Next, the three-dimensional phase difference data are generated by subtraction between a complex phase of the first three-dimensional phase data in the first three-dimensional real-space data for correction and a complex phase of the second three-dimensional phase data in the second three-dimensional real-space data for correction. Finally, the first, second, and third correction data are acquired by calculating respective gradients of phase with respect to the three orthogonal directions from the three-dimensional phase difference data.

Although the cross-sectional shape of the columnar region is not particularly limited, it may be a square, a rectangle, a circle, or a star as shown in the right part of FIG. 16, for example.

Fourth Embodiment

In the three-dimensional radial acquisition method such as the Koosh-Ball acquisition method and the Oblique Stack of Stars collection method, as described above, the first correction data ($\Delta kx$ or $\Delta tx$), the second correction data ($\Delta ky$ or $\Delta ty$), and the third correction data ($\Delta kz$ or $\Delta tz$) corresponding to the respective three orthogonal directions are generated as the corrected data. In the third embodiment, in order to generate these first to third correction data, as shown in FIG. 16A and FIG. 16B, the MRI apparatus 1 acquires the columnar three-dimensional k-space data for correction while changing the direction angle in the three-dimensional space.

In the fourth embodiment, the band-shaped two-dimensional k-space data for correction are acquired by two rotations around the first rotation axis and around the second rotation axis, and thereby the first to third correction data corresponding to the respective three orthogonal directions are generated.

Figures 17A, 17B:
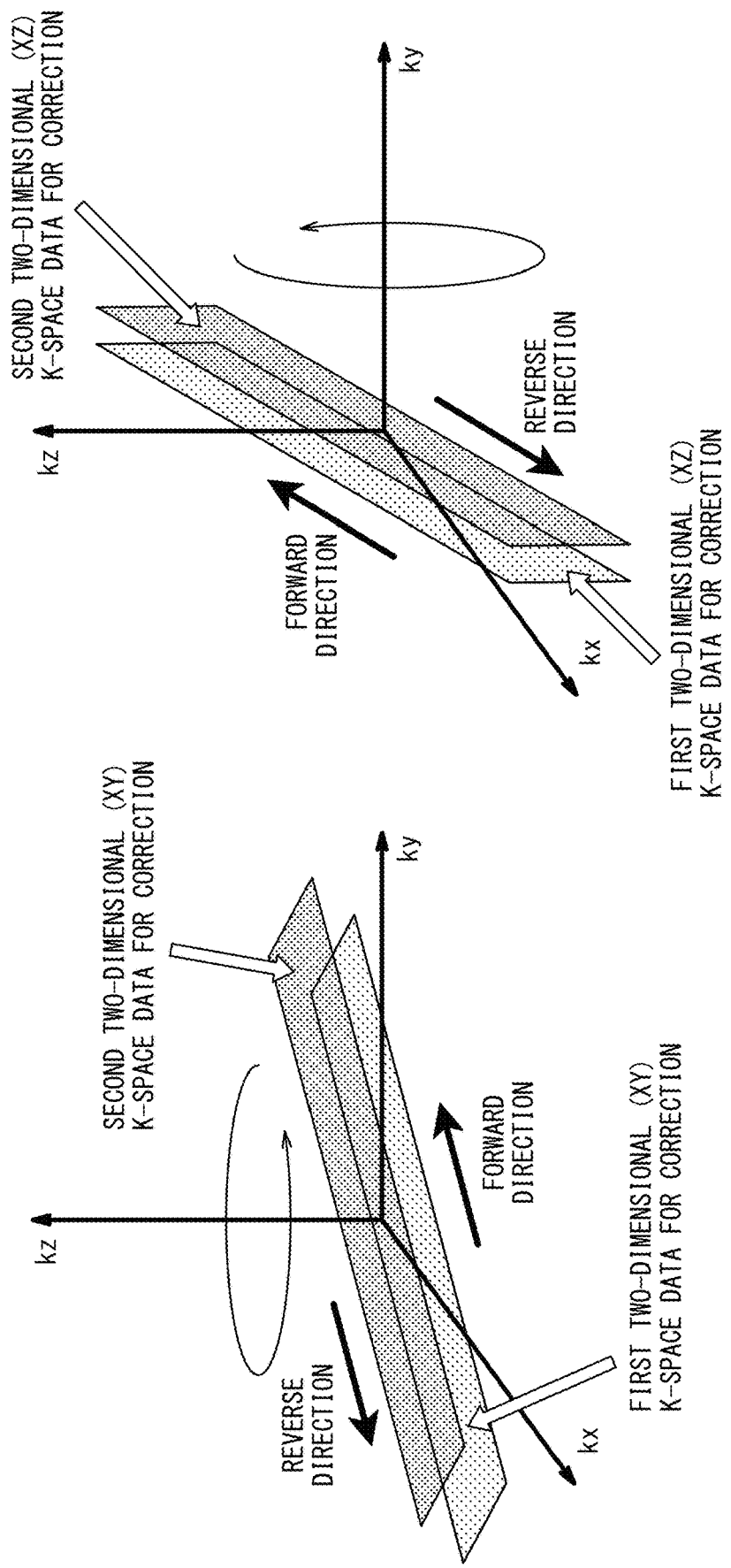
FIG. 17A and FIG. 17B are schematic diagrams for illustrating a second case of a prescan that corresponds to a three-dimensional radial acquisition method.

FIG. 17A and FIG. 17B are schematic diagrams illustrating the concept of the acquisition method of the k-space data for correction in the fourth embodiment. In this acquisition method, for example, the MRI apparatus 1 performs the first data acquisition while rotating the acquisition region of the band-shaped two-dimensional k-space data for correction (i.e., the first two-dimensional (XY) k-space data for correction illustrated in FIG. 17A) to be read out in the forward direction on the X-Y plane around the Z-axis, and rotating the acquisition region of the band-shaped two-dimensional k-space data for correction (i.e., the second two-dimensional (XY) k-space data for correction illustrated in FIG. 17A) to be read out in the reverse direction on the X-Y plane around the Z-axis.

Subsequently, the MRI apparatus 1 performs the second data acquisition while rotating the acquisition region of the band-shaped two-dimensional k-space data for correction (i.e., the first two-dimensional (XZ) k-space data for correction illustrated in FIG. 17B) to be read out in the forward direction on the X-Z plane around the Y-axis, and rotating the acquisition region of the band-shaped two-dimensional k-space data for correction (i.e., the second two-dimensional (XZ) k-space data for correction illustrated in FIG. 17B) to be read out in the reverse direction on the X-Z plane around the Y-axis.

Thereafter, the first correction data ($\Delta kx$ or $\Delta tx$) and the second correction data ($\Delta ky$ or $\Delta ty$) are calculated from the k-space data for correction acquired around the Z-axis in the first data acquisition. Similarly, the first correction data ($\Delta kx$ or $\Delta tx$) and the third correction data ($\Delta kz$ or $\Delta tz$) are calculated from the k-space data for correction acquired around the Z-axis in the second data acquisition, for example.

As described above, in the fourth embodiment, the number of k-space data for correction for generating the first to third correction data, which respectively correspond to three orthogonal directions in a three-dimensional space, can be made smaller than that in the third embodiment. In other words, in the fourth embodiment, time of the prescan can be shorter than in the third embodiment.

In the above-described embodiment, the rotation plane at the time of acquiring the k-space data for correction is the X-Y plane and the X-Z plane. However, the rotation plane at the time of acquiring the k-space data for correction does not need to match the rotation plane of the diagnostic scan. That is, the rotation plane at the time of acquiring the k-space data for correction and the rotation plane of the diagnostic scan can be selected independently of each other. For example, when the diagnostic scan is performed by using the Oblique Stack of Stars method, the angle of Oblique can be set in an arbitrary direction in a three-dimensional space.

As described above, the MRI apparatus of each embodiment can correct the trajectory error to be generated in the radial acquisition method with higher accuracy than the conventional method and can generate a high-quality image with less distortion and less misregistration.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MRI apparatus comprising:
a scanner including at least two gradient coils; and
processing circuitry configured to
cause the scanner to acquire k-space data for correction in a band-shaped two-dimensional k-space along a readout direction, or in a columnar three-dimensional k-space along a readout direction, while changing rotation angles, wherein each of the rotation angles corresponds to the readout direction,
generate correction data for correcting an error due to a gradient magnetic field generated by the gradient coils, by using the acquired k-space data for correction,
cause the scanner to acquire k-space data for reconstruction, based on a radial acquisition method in which the k-space data for reconstruction are acquired while the readout direction is being changed so as to rotate around an origin of the k-space, while correcting the gradient magnetic field by using the correction data, and
generate an image by reconstructing the acquired k-space data for reconstruction.

2. The MRI apparatus according to claim 1, wherein the processing circuitry is configured to
acquire first k-space data for correction by sampling in a forward direction of the readout direction,
acquire second k-space data for correction by sampling in a reverse direction of the readout direction, and generate, for each of the rotation angles, first correction data and second correction data which respectively correspond to two orthogonal directions in a rotation plane, by using the acquired first k-space data for correction and the acquired second k-space data for correction.

3. The MRI apparatus according to claim 2, wherein the processing circuitry is configured to
generate first real-space data for correction by performing two-dimensional Fourier transform on the first k-space data for correction,
generate second real-space data for correction by performing two-dimensional Fourier transform on the second k-space data for correction,
calculate two-dimensional phase difference data by subtraction between a complex phase of the first real-space data for correction and a complex phase of the second real-space data for correction,
calculate a gradient of phase with respect to the two orthogonal directions from the two-dimensional phase difference data, and
generate the first correction data and the second correction data based on the gradient of phase.

4. The MRI apparatus according to claim 1, wherein the processing circuitry is configured to cause the scanner to acquire the k-space data for reconstruction, while correcting an application timing of the gradient magnetic field by using the correction data.

5. The MRI apparatus according to claim 1, wherein the processing circuitry is configured to cause the scanner to acquire the k-space data for reconstruction, while correcting strength of the gradient magnetic field by using the correction data.

6. The MRI apparatus according to claim 1, wherein the processing circuitry is configured to cause the scanner to acquire the k-space data for reconstruction, while equivalently correcting the gradient magnetic field by adjusting a readout timing of the k-space data for reconstruction, using the correction data.

7. The MRI apparatus according to claim 1, wherein the processing circuitry is configured to
acquire first k-space data for correction by sampling in the columnar three-dimensional k-space in a forward direction of the readout direction,
acquire second k-space data for correction by sampling in the columnar three-dimensional k-space in a reverse direction of the readout direction, and
generate, for each of the rotation angles of the readout direction, first correction data, second correction data, and third correction data which respectively correspond to three orthogonal directions in a three-dimensional space, by using the acquired first k-space data for correction and the acquired second k-space data for correction.

8. The MRI apparatus according to claim 7, wherein the processing circuitry is configured to
generate first real-space data for correction by performing three-dimensional Fourier transform on the first k-space data for correction,
generate second real-space data for correction by performing three-dimensional Fourier transform on the second k-space data for correction,
calculate three-dimensional phase difference data by subtraction between a complex phase of the first real-space data for correction and a complex phase of the second real-space data for correction,
calculate a gradient of phase with respect to the three orthogonal directions from the three-dimensional phase difference data, and
generate the first correction data, the second correction data, and the third correction data based on the gradient of phase.

9. The MRI apparatus according to claim 1, wherein the processing circuitry is configured to cause the scanner to acquire the k-space data for correction, before acquiring the k-space data for reconstruction, each time the k-space data for reconstruction is acquired.

10. The MRI apparatus according to claim 1, further comprising a memory configured to store the correction data, wherein the processing circuitry is configured to
cause the scanner to acquire the k-space data for correction at least once, before acquiring the k-space data for reconstruction,
store the correction data in the memory,
read out the correction data from the memory when the correction data are stored in the memory, and
cause the scanner to acquire the k-space data for reconstruction, while correcting the gradient magnetic field by using the correction data.

11. An MRI apparatus comprising:
a scanner including at least two gradient coils; and
processing circuitry configured to
cause the scanner to acquire k-space data for correction in a band-shaped two-dimensional k-space along a readout direction, or in a columnar three-dimensional k-space along a readout direction, while changing rotation angles, wherein each of the rotation angles corresponds to the readout direction,
generate correction data for correcting an error due to a gradient magnetic field generated by the gradient coils, by using the acquired k-space data for correction,
cause the scanner to acquire k-space data for reconstruction based on a radial acquisition method in which the k-space data for reconstruction are acquired while the readout direction is being changed so as to rotate around an origin of the k-space,
correct the k-space data for reconstruction by using the correction data, and
generate an image by reconstructing the corrected k-space data for reconstruction.

12. The MRI apparatus according to claim 11, wherein the processing circuitry is configured to
acquire first k-space data for correction by sampling in a forward direction of the readout direction,
acquire second k-space data for correction by sampling in a reverse direction of the readout direction, and
generate, for each of the rotation angles, first correction data and second correction data which respectively correspond to two orthogonal directions in a rotation plane, by using the acquired first k-space data for correction and the acquired second k-space data for correction.

13. The MRI apparatus according to claim 12, wherein the processing circuitry is configured to
generate first real-space data for correction by performing two-dimensional Fourier transform on the first k-space data for correction,
generate second real-space data for correction by performing two-dimensional Fourier transform on the second k-space data for correction, calculate two-dimensional phase difference data by subtraction between a complex phase of the first real-space data for correction and a complex phase of the second real-space data for correction, calculate a gradient of phase with respect to the two orthogonal directions from the two-dimensional phase difference data, and generate the first correction data and the second correction data based on the gradient of phase.

14. The MRI apparatus according to claim 11, wherein the processing circuitry is configured to generate the image in such a manner that the error due to the gradient magnetic field is corrected, by performing positional correction on the k-space data for reconstruction in k-space, using the correction data.

15. The MRI apparatus according to claim 11, wherein the processing circuitry is configured to acquire first k-space data for correction by sampling in the columnar three-dimensional k-space in a forward direction of the readout direction, acquire second k-space data for correction by sampling in the columnar three-dimensional k-space in a reverse direction of the readout direction, and generate, for each of the rotation angles, first correction data, second correction data, and third correction data which respectively correspond to three orthogonal directions in a three-dimensional space, by using the acquired first k-space data for correction and the acquired second k-space data for correction.

16. The MRI apparatus according to claim 15, wherein the processing circuitry is configured to generate first real-space data for correction by performing three-dimensional Fourier transform on the first k-space data for correction, generate second real-space data for correction by performing three-dimensional Fourier transform on the second k-space data for correction, calculate three-dimensional phase difference data by subtraction between a complex phase of the first real-space data for correction and a complex phase of the second real-space data for correction, calculate a gradient of phase with respect to the three orthogonal directions from the three-dimensional phase difference data, and generate the first correction data, the second correction data, and the third correction data based on the gradient of phase.

17. The MRI apparatus according to claim 11, wherein the processing circuitry is configured to cause the scanner to acquire the k-space data for correction, before or after acquiring the k-space data for reconstruction, each time the k-space data for reconstruction is acquired.

18. The MRI apparatus according to claim 11, further comprising a memory configured to store the correction data, wherein the processing circuitry is configured to cause the scanner to acquire the k-space data for correction at least once, before or after acquiring the k-space data for reconstruction, store the correction data in the memory, read out the correction data from the memory when the correction data are stored in the memory, correct the k-space data for reconstruction by using the read out correction data, and generate an image by reconstructing the corrected k-space data for reconstruction.

19. An MRI method comprising:

acquiring k-space data for correction in a band-shaped two-dimensional k-space along a readout direction, or in a columnar three-dimensional k-space along a readout direction, while changing rotation angles, wherein each of the rotation angles corresponds to the readout direction, generating correction data for correcting an error due to a gradient magnetic field generated by gradient coils of an MRI apparatus, by using the acquired k-space data for correction, acquiring k-space data for reconstruction based on a radial acquisition method in which the k-space data for reconstruction are acquired while the readout direction is being changed so as to rotate around an origin of the k-space, while correcting the gradient magnetic field by using the correction data, and generating an image by reconstructing the acquired k-space data for reconstruction.

20. An MRI method comprising:

acquiring k-space data for correction in a band-shaped two-dimensional k-space along a readout direction, or a columnar three-dimensional k-space along a readout direction, while changing rotation angles, wherein each of the rotation angles corresponds to the readout direction, generating correction data for correcting an error due to a gradient magnetic field generated by gradient coils of an MRI apparatus, by using the acquired k-space data for correction, acquiring k-space data for reconstruction based on a radial acquisition method in which the k-space data for reconstruction are acquired while the readout direction is being changed so as to rotate around an origin of the k-space, correcting the k-space data for reconstruction by using the correction data, and generating an image by reconstructing the corrected k-space data for reconstruction.

* * * * *